(12) United States Patent
Tabatabaei et al.

(10) Patent No.: US 7,590,902 B1
(45) Date of Patent: Sep. 15, 2009

(54) METHODS AND APPARATUSES FOR EXTERNAL DELAY TEST OF INPUT-OUTPUT CIRCUITS

(75) Inventors: Sassan Tabatabaei, Sunnyvale, CA (US); Yervant Zorian, Santa Clara, CA (US)

(73) Assignee: Virage Logic Corporation, Fremont, CA (US)

( * ) Notice: Subject to any disclaimer, the term of this patent is extended or adjusted under 35 U.S.C. 154(b) by 104 days.

(21) Appl. No.: 11/520,423

(22) Filed: Sep. 12, 2006

Related U.S. Application Data

(60) Provisional application No. 60/716,386, filed on Sep. 12, 2005.

(51) Int. Cl.
*G01R 31/28* (2006.01)
(52) U.S. Cl. .................................... 714/724
(58) Field of Classification Search .................. 714/724
See application file for complete search history.

(56) References Cited

U.S. PATENT DOCUMENTS

| | | | |
|---|---|---|---|
| 5,062,122 A | 10/1991 | Pham et al. | |
| 5,670,890 A | 9/1997 | Colwell et al. | |
| 5,915,105 A | 6/1999 | Farmwald et al. | |
| 5,954,804 A | 9/1999 | Farmwald et al. | |
| 5,995,443 A | 11/1999 | Farmwald et al. | |
| 6,011,732 A | 1/2000 | Harrison et al. | |
| 6,026,216 A * | 2/2000 | Ohtsuka et al. | 358/1.9 |
| 6,032,214 A | 2/2000 | Farmwald et al. | |
| 6,035,365 A | 3/2000 | Farmwald et al. | |
| 6,044,426 A | 3/2000 | Farmwald et al. | |
| 6,049,846 A | 4/2000 | Farmwald et al. | |
| 6,075,614 A * | 6/2000 | Ohtsuka et al. | 358/1.1 |
| 6,085,284 A | 7/2000 | Farmwald et al. | |
| 6,100,735 A | 8/2000 | Lu | |
| 6,101,152 A | 8/2000 | Farmwald et al. | |
| 6,107,826 A | 8/2000 | Young et al. | |
| 6,166,563 A | 12/2000 | Volk et al. | |
| 6,173,432 B1 | 1/2001 | Harrison | |
| 6,260,163 B1 | 7/2001 | Lacroix et al. | |
| 6,260,263 B1 | 7/2001 | Haase | |
| 6,262,585 B1 | 7/2001 | Frodsham et al. | |
| 6,348,811 B1 | 2/2002 | Haycock et al. | |
| 6,348,826 B1 | 2/2002 | Mooney et al. | |
| 6,384,781 B1 * | 5/2002 | Kautz et al. | 342/368 |
| 6,397,361 B1 | 5/2002 | Saitoh | |
| 6,421,801 B1 | 7/2002 | Maddux et al. | |
| 6,425,097 B1 | 7/2002 | Elachkar et al. | |

(Continued)

OTHER PUBLICATIONS

Fast calibrated stereo vision for manipulation Mulligan, J.; Robotics and Automation, 1996. Proceedings., 1996 IEEE International Conference on vol. 3, Apr. 22-28, 1996 pp. 2326-2331 vol. 3 Digital Object Identifier 10.1109/ROBOT.1996.506511.*

(Continued)

*Primary Examiner*—Michael B Holmes
(74) *Attorney, Agent, or Firm*—Rutan & Tucker LLP

(57) ABSTRACT

Various methods and apparatuses are described for a system that includes some on-chip components, e.g., I-Os, test processors, soft wrappers, etc., an external testing unit that provides Parametric Measurement Unit (PMU) capability, and various tests performed on the I-Os by the on-chip testing logic, the test vector patterns supplied by the external testing unit.

21 Claims, 16 Drawing Sheets

U.S. PATENT DOCUMENTS

| | | | |
|---|---|---|---|
| 6,429,715 B1 | 8/2002 | Bapat et al. | |
| 6,445,231 B1 | 9/2002 | Baker et al. | |
| 6,449,738 B1 | 9/2002 | Hinedi et al. | |
| 6,452,432 B2 | 9/2002 | Kim | |
| 6,455,332 B1* | 9/2002 | Singh et al. | 438/5 |
| 6,476,652 B1 | 11/2002 | Lee et al. | |
| 6,477,674 B1 | 11/2002 | Bates et al. | |
| 6,483,360 B2 | 11/2002 | Nakamura | |
| 6,486,919 B1 | 11/2002 | Kim | |
| 6,492,798 B2 | 12/2002 | Sunter | |
| 6,492,851 B2 | 12/2002 | Watarai | |
| 6,502,050 B1 | 12/2002 | Chan | |
| 6,580,304 B1 | 6/2003 | Rieven | |
| 6,586,921 B1 | 7/2003 | Sunter | |
| 6,618,133 B2* | 9/2003 | Hedges et al. | 356/141.4 |
| 6,629,274 B1 | 9/2003 | Tripp et al. | |
| 6,639,426 B2 | 10/2003 | Haycock et al. | |
| 6,657,936 B2 | 12/2003 | Harvey et al. | |
| 6,671,847 B1 | 12/2003 | Chao et al. | |
| 6,691,269 B2 | 2/2004 | Sunter | |
| 6,700,670 B1* | 3/2004 | Poris | 356/625 |
| 6,711,718 B2 | 3/2004 | Pfeil et al. | |
| 6,731,128 B2 | 5/2004 | Das et al. | |
| 6,750,688 B2 | 6/2004 | Takai | |
| 6,754,613 B2 | 6/2004 | Tabatabaei et al. | |
| 6,760,873 B1 | 7/2004 | Hao et al. | |
| 6,760,899 B1 | 7/2004 | Young et al. | |
| 6,772,620 B1* | 8/2004 | Poris | 73/1.81 |
| 6,774,694 B1 | 8/2004 | Stern et al. | |
| 6,777,995 B1 | 8/2004 | Harrison | |
| 6,795,046 B2* | 9/2004 | Janssen et al. | 345/87 |
| 6,823,500 B1 | 11/2004 | Ganesh et al. | |
| 6,832,361 B2 | 12/2004 | Cohn et al. | |
| 6,839,860 B2 | 1/2005 | Lin | |
| 6,850,871 B1* | 2/2005 | Barford et al. | 703/2 |
| 6,857,080 B1 | 2/2005 | Liang | |
| 6,865,135 B2 | 3/2005 | Choi | |
| 6,900,679 B2 | 5/2005 | Watarai | |
| 6,914,852 B2 | 7/2005 | Choi | |
| 6,934,215 B2 | 8/2005 | Chung et al. | |
| 6,985,648 B2* | 1/2006 | Kish et al. | 385/14 |
| 6,993,318 B2* | 1/2006 | McNew et al. | 455/404.2 |
| 7,043,109 B2* | 5/2006 | Kish et al. | 385/14 |
| 7,053,992 B2* | 5/2006 | LaBelle et al. | 356/6 |
| 7,062,114 B2* | 6/2006 | Webjorn et al. | 385/14 |
| 7,129,476 B2* | 10/2006 | Ishitsu et al. | 250/252.1 |
| 7,133,793 B2* | 11/2006 | Ely et al. | 702/104 |
| 7,142,873 B2* | 11/2006 | McNew et al. | 455/456.1 |
| 7,148,763 B2* | 12/2006 | Sutardja | 331/176 |
| 7,161,397 B2 | 1/2007 | Lee et al. | |
| 7,181,704 B1 | 2/2007 | Downs et al. | |
| 7,199,625 B1 | 4/2007 | Chung | |
| 7,202,719 B2 | 4/2007 | Gabato et al. | |
| 7,206,710 B2* | 4/2007 | Zhou et al. | 702/107 |
| 7,254,729 B2 | 8/2007 | Matsushima et al. | |
| 7,256,600 B2 | 8/2007 | Walker et al. | |
| 7,262,623 B1 | 8/2007 | Mark et al. | |
| 7,283,694 B2* | 10/2007 | Welch et al. | 385/14 |
| 7,286,644 B2* | 10/2007 | Andrews | 378/138 |
| 7,312,438 B2* | 12/2007 | Ishitsu et al. | 250/252.1 |
| 7,340,122 B2* | 3/2008 | Welch et al. | 385/14 |
| 7,401,493 B2* | 7/2008 | Forrest | 73/1.06 |
| 7,414,707 B2* | 8/2008 | LaBelle et al. | 356/6 |
| 7,460,742 B2* | 12/2008 | Joyner | 385/14 |
| 2001/0024135 A1 | 9/2001 | Harrison | |
| 2001/0026183 A1 | 10/2001 | Kim | |
| 2001/0030553 A1 | 10/2001 | Aihara | |
| 2001/0035784 A1 | 11/2001 | Watarai | |
| 2002/0015460 A1 | 2/2002 | Bhullar et al. | |
| 2002/0027461 A1 | 3/2002 | Kusunoki | |
| 2002/0036526 A1 | 3/2002 | Nakamura | |
| 2002/0041196 A1 | 4/2002 | Demone et al. | |
| 2002/0057624 A1 | 5/2002 | Manning | |
| 2002/0153914 A1 | 10/2002 | Arabi et al. | |
| 2002/0154723 A1 | 10/2002 | Nakamura | |
| 2002/0157031 A1 | 10/2002 | Lin | |
| 2003/0001638 A1 | 1/2003 | Watarai | |
| 2003/0005374 A1 | 1/2003 | Fought et al. | |
| 2003/0030461 A1 | 2/2003 | Oberle et al. | |
| 2003/0067333 A1 | 4/2003 | Nakamura | |
| 2003/0071606 A1 | 4/2003 | Sunter | |
| 2003/0099321 A1 | 5/2003 | Juan et al. | |
| 2003/0151433 A1 | 8/2003 | Takai | |
| 2003/0196153 A1 | 10/2003 | Evans | |
| 2003/0199262 A1 | 10/2003 | Chung | |
| 2003/0208708 A1 | 11/2003 | Sunter | |
| 2004/0027993 A1 | 2/2004 | Ghiasi et al. | |
| 2004/0051551 A1 | 3/2004 | Sunter | |
| 2004/0062121 A1 | 4/2004 | Chung et al. | |
| 2004/0098648 A1 | 5/2004 | Sunter | |
| 2004/0109464 A1 | 6/2004 | Seo et al. | |
| 2004/0119455 A1 | 6/2004 | Sunter | |
| 2004/0123197 A1 | 6/2004 | Sunter | |
| 2004/0153931 A1 | 8/2004 | Cao et al. | |
| 2004/0179640 A1 | 9/2004 | Jacob et al. | |
| 2004/0186675 A1 | 9/2004 | Larson et al. | |
| 2004/0196064 A1 | 10/2004 | Garlepp et al. | |
| 2004/0221197 A1 | 11/2004 | Goyal et al. | |
| 2004/0223571 A1 | 11/2004 | Donnelly et al. | |
| 2004/0246017 A1 | 12/2004 | Arabi et al. | |
| 2005/0007157 A1 | 1/2005 | Harrison | |
| 2005/0025190 A1 | 2/2005 | Frisch | |

OTHER PUBLICATIONS

Hardware and software implementation for an auto-calibrated measurement system Kouider, M.; Nadi, M.; Kourtiche, D.; Prado Olivarez, J.; Rouane, A.; Sensors, 2003. Proceedings of IEEE vol. 1, Oct. 22-24, 2003 pp. 611-616 vol. 1 Digital Object Identifier 10.1109/ICSENS.2003.1279010.*

Theoretical and empirical error analysis for the direct calibration of resonant partial discharge detection circuitry Bilodeau, T.M.; Sarjeant, W.J.; Dollinger, R.E.; Electrical Insulation and Dielectric Phenomena, 1990. Annual Report., Conference on Oct. 28-31, 1990 pp. 361-366 Digital Object Identifier 10.1109/CEIDP.1990.201368.*

Improved resolution for 3D position sensitive CdZnTe spectrometers Feng Zhang; Zhong He; Dan Xu; Knoll, G.F.; Wehe, D.K.; Berry, J.E.; Nuclear Science Symposium Conference Record, 2003 IEEE vol. 5, Oct. 19-25, 2003 pp. 3356-3360 vol. 5.*

Calibration Algorithm of Granularity Distribution Measurement Jiang Haiying; Sun Jie; Wang Qi; Liu Weidong; Electronic Measurement and Instruments, 2007. ICEMI '07. 8th International Conference on Aug. 16, 2007-Jul. 18, 2007 pp. 3-853-3-857 Digital Object Identifier 10.1109/ICEMI.2007.4351051.*

Bayesian Calibration of a Lookup Table for ADC Error Correction De Vito, L.; Lundin, H.; Rapuano, S.; Instrumentation and Measurement, IEEE Transactions on vol. 56, Issue 3, Jun. 2007 pp. 873-878 Digital Object Identifier 10.1109/TIM.2007.894171.*

The CAT-exact data transfer to DDS-generated clock domains in a single-chip modular solution Gage, R.; Brown, B.; Test Conference, 1998. Proceedings., International Oct. 18-23, 1998 pp. 507-513 Digital Object Identifier 10.1109/TEST.1998.743193.*

A test site thermal control system for at-speed manufacturing testing Malinoski, M.; Maveety, J.; Knostman, S.; Jones, T.; Test Conference, 1998. Proceedings., International Oct. 18-23, 1998 pp. 119-128 Digital Object Identifier 10.1109/TEST.1998.743145.*

Non-Final Office Action for U.S. Appl. No. 11/340,147 mailed Sep. 26, 2007, 7 pages.

Adham, Saman, et al., "Preliminary Outline of the IEEE P1500 Scaleable Architecture for Testing Embedded Cores," IEEE P1500 Architecture Task Force, 1999, 6 pages.

Arkin, Brian, "Realizing a Production ATE Custom Processor and Timing IC Containing 400 Independent Low-Power and High-Linearity Timing Verniers," IEEE International Solid-State Circuits Conference, Feb. 2004.

Bonnett, David, "IEEE 1149.1 yields new standards," Test & Measurement World, http://www.reed-electronics.com/tmworld/article/CA202501.html, Apr. 2002.

Christiansen, Jorgen, "An Integrated High Resolution CMOS Timing Generator Based on an Array of Delay Locked Loops," IEEE Journal of Solid State Circuits, Jul. 1996, pp. 952-957, 31:7.

Gillis, Pamela, et al, "Delay Test of Chip I/Os Using LSSD Boundary Scan," IEEE International Test Conference, Aug. 1998, pp. 83-90, Paper 4.1.

Hwang, Chorng-Sii, et al, "A High-Precision Time-to-Digital Converter Using a Two-Level Conversion Scheme," IEEE Transactions on Nuclear Science, Aug. 2004, pp. 1349-1352, 51:4.

Kuo, Andy, et al, "Jitter Models and Measurement Methods for High-Speed Serial Interconnects," ITC International Test Conference, Feb. 2004, pp. 1295-1302, Paper 46.1.

Kuo, Andy, et al, "Crosstalk Bounded Uncorrelated Jitter (BUJ) for High-Speed Interconnects," IEEE Transactions on Instrumentation and Measurement, Oct. 2005, pp. 1800-1810, 54:5.

Mantyniemi, Antti, et al, "A High Resolution Digital CMOS Time-to-Digital Converter Based on Nested Delay Locked Loops," IEEE, 1999, pp. 537-540.

Nelson, Rick, "PCB test: nails or TAP?" http://www.reed-electronics.com/tmworld/article/CA239852.html, Sep. 2002.

Ou, Nelson, et al, "Jitter Models for Design and Test of Gbps-Speed Serial Interconnects," IEEE Design & Test of Computers, IEEE Design & Test of Computers, Jul.-Aug. 2004, pp. 302-313.

Santos, Dinis M, et al, "A CMOS Delay Locked Loop and Sub-Nanosecond Time-to-Digital Converter Chip," 1996, pp. 289-291.

Sunter, Stephen K, et al, "Complete, Contactless I/O Testing—Reaching the Boundary in Minimizing Digital IC Testing Cost," ITC International Test Conference, Apr. 2002, pp. 446-455, Paper 16.2.

Tabatabaei, Sassan, et al, "Embedded Timing Analysis: A SoC Infrastructure," IEEE Design & Test of Computers, May-Jun. 2002, pp. 24-36.

Tabatabaei, Sassan, et al, "An Embedded Core for Sub-Picosecond Timing Measurements," ITC International Test Conference, Apr. 2002, pp. 129-137, Paper 5.3.

Tabatabaei, Sassan, et al, "Jitter Generation and Measurement for Test of Multi-Gbps Serial IO," ITC International Test Conference, Feb. 2004, pp. 1313-1321, Paper 46.3.

"Boundary-Scan Tutorial," Corelis, http://www.corelis.com/products/Boundary-Scan_Tutorial.htm, date unknown.

"IEEE Standard Test Access Port and Boundary-Scan Architecture," The Institute of Electrical and Electronics Engineering, Inc., 2001, pp. i-iv and 1-200.

"IEEE Standard for a Mixed-Signal Test Bus," Test Technology Technical Committee of IEEE Computer Society, IEEE std 1149.4, pp. i-vi and 1-78, Approved Jun. 26, 1999.

"Standard Testability Method for Embedded Core-Based Integrated Circuits," (Draft), Test Technology Technical Committee of IEEE Computer Society, Standard IEEE 1500/D11, pp. i-vii and 1-131, Jan. 2005.

Non-Final Office Action for U.S. Appl. No. 11/340,147 mailed Apr. 30, 2008, 4 pages.

Non-Final Office Action for U.S. Appl. No. 11/510,035 mailed Nov. 14, 2007, 22 pages.

Non-Final Office Action for U.S. Appl. No. 11/510,035 mailed Jul. 2, 2008, 26 pages.

Final Office Action for U.S. Appl. No. 11/340,147 mailed Jan. 23, 2009, 6 pages.

Non-Final Office Action for U.S. Appl. No. 11/520,344 mailed Nov. 20, 2008, 9 pages.

Non-Final Office Action for U.S. Appl. No. 11/520,480 mailed Oct. 31, 2008, 8 pages.

Non-Final Office Action for U.S. Appl. No. 11/520,282 mailed Oct 30, 2008, 8 pages.

Non-Final Office Action for U.S. Appl. No. 11/520,530 mailed Nov. 24, 2008, 10 pages.

Non-Final Office Action for U.S. Appl. No. 11/510,035 mailed Oct. 24, 2008, 17 pages.

* cited by examiner

| 9 | 8 | 7 | 6 | 5 | 4 | 3 | 2 | 1 | 0 |
|---|---|---|---|---|---|---|---|---|---|
| mode1_reg | mode2_reg | mode3_reg | mode4_reg | t_mode_reg | t_cal_en_reg | abus_reg | vi_mode_reg | vo_mode_reg | transfer_en_reg |

FIG. 4B

METHODS AND APPARATUSES FOR EXTERNAL DELAY TEST OF INPUT-OUTPUT CIRCUITS

RELATED APPLICATIONS

This application claims priority to U.S. Provisional Patent Application No. 60/716,386, entitled VARI-OUS METHODS AND APPARATUSES FOR INPUT-OUTPUT DESIGNS, filed on Sep. 12, 2005.

FIELD OF THE INVENTION

Aspects of embodiments of the invention generally relate to the field of self test and repair for Input-Output circuits (I-Os). More specifically, an embodiment of the invention provides Direct Current (DC) test features for I-Os.

BACKGROUND OF THE INVENTION

Any integrated circuit (IC) device typically includes a number of input/output (I-O) circuitry to communicate information with the outside world. Different types of I-Os may be used in a chip that supports different signal voltage levels, current drives, data protocol, and data rates. I-Os, like all other circuits on the chip, are subject to random defects and statistical process variations, which may render them faulty. Consequently, the I-O circuits are tested to ensure they meet their advertised specifications. The I-O test methodology employed strongly depends on the type of the I-O in general. However, almost all types of I-O are tested for DC parameters because such tests reveal a significant portion of faults very quickly.

The most widely used DC test methodologies are based on automatic test equipment (ATE). Each I-O is connected to an external tester pin, through which the I-O connects to a parametric measurement unit (PMU). The PMU is capable of forcing voltage and measuring current or forcing current and measuring voltage. These capabilities enable the PMU to perform a wide variety of tests, such as output voltage, drive current, leakage current, and input voltage threshold tests. Such testers may use serial or parallel approach to test all the I-Os connected to the ATE pins. Although flexible and fast, the use of ATE for I-O test is becoming increasingly expensive because of large tester pin requirements.

SUMMARY OF THE INVENTION

One embodiment of the invention may be as follows. Various methods and apparatuses are described for a system that includes some on-chip components, e.g., I-Os, test processors, soft wrappers, etc., an external testing unit that provides Parametric Measurement Unit (PMU) capability, and various tests performed on the I-Os by the on-chip testing logic and external testing unit.

BRIEF DESCRIPTION OF THE DRAWINGS

The drawings refer to embodiments of the invention in which:

FIG. 4b illustrates an embodiment of a MODE register;

Figure 1:
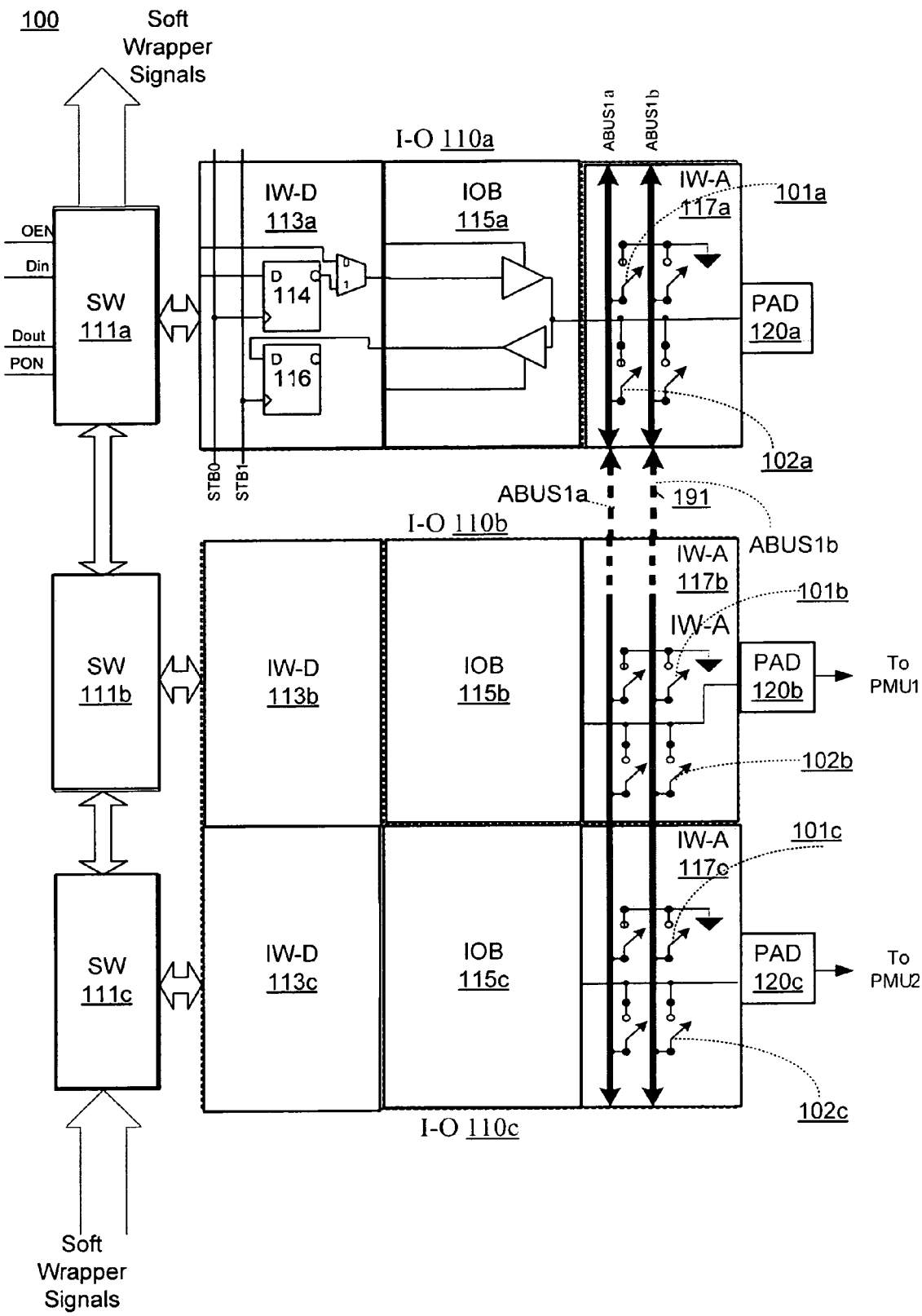
FIG. 1 illustrates a block diagram of an embodiment of one I-O chain segment including a series of wrappers.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, etc., in order to provide a thorough understanding of the embodiments of the invention. It will be apparent, however, to one of ordinary skill in the art that the embodiments of the invention may be practiced without these specific details. However, the specific numeric references should not be interpreted as a literal sequential order but rather interpreted as a first group of I-Os being different from a second group of I-Os. Thus, the specific details set forth are merely exemplary. The specific details may be varied from and still be contemplated to be within the spirit and scope of the claims.

In general, various methods and apparatuses are described for a system that includes some on-chip components, e.g., I-Os, test processors, soft wrappers, etc., an external testing unit that provides Parametric Measurement Unit (PMU) capability, and various tests performed on the I-Os by the on-chip testing logic and external testing unit.

External testing capabilities are provided by a generalized test and repair solution for I-Os that may be packaged within manufactured devices. Using a Self-Test and Repair I-O System ("SIS"), a system-on-a-chip ("SOC") with hundreds or even thousands of I-Os may be tested by using a tester that supports only a few tens of pins. Test patterns are supplied in an external tester and output analysis is also done in the tester.

The design enables sequential access to the I-Os for analog, timing and digital data access. This provides access to all I-Os without causing routing congestions in the chip. Accordingly, analog access to digital I-O buffers is provided without adding dedicated I-Os to the chip, as could be required under IEEE 1149.4 standard. Further, an uninterrupted chain of testable I-Os is segmented together. Multiple on-chip analog buses are used to provide external access to the I-Os in a segmented I-O chain through at least two I-Os of the plurality of I-Os but less than all of the plurality of I-Os within the segment. These I-Os couple to an external tester that provides PMU functionality. The testable I-Os are bi-directional, in that they can send and receive data.

Strobes to the I-Os may be routed using buffers and two buses that form a ring around the chip, to avoid routing congestion. Additional calibration methods are provided that avoid loss of accuracy that can result from such routing strategy. Also, a central test processor controls all operations of SIS, generates test patterns, and analyzes the results, and communicates with external test equipment.

FIG. 1 illustrates a block diagram of an embodiment of one I-O chain segment including a series of wrappers. I-O segment 100 includes an example number of I-Os 110a, 110b, and 110c. In many cases, an IC may contain groups of SIS-enabled I-Os and groups of I-Os that are not SIS-enabled, e.g., SERDES I-Os, I-Os without required SIS wrappers, and so on. In such cases, the I-Os may be segmented together. A segment is an uninterrupted chain of testable I-Os and/or a grouping of I-Os that possess similar input-output voltage characteristics. In a segmented I-O chain, multiple on-chip analog buses are used to provide external access to the I-Os through two I-Os or potentially more but less than all of the I-Os within the segment. In one embodiment, two I-Os from each segment may be connected to external PMUs to provide DC test access to all I-Os in that segment.

FIG. 1 shows how a series of I-Os are accessed sequentially for analog, timing test, and digital access. The analog access is provided by analog buses (ABUS1a and ABUS1b). The timing test access is provided by strobe buses (STB0 and STB1). Digital access is made possible by soft wrappers (111a, 111b, and 111c) that are connected to their corresponding I-Os and the soft wrappers of the immediately adjacent I-Os. For instance, soft wrapper 111a is connected to its corresponding I-O 110a and to the soft wrapper 111b of the immediately adjacent I-Os 110b. The sequentially connected I-O wrappers perform all the logical and parametric tests. The design provides adequate access to I-Os for DC, timing, and logical test and measurements without causing routing congestion or requiring significant area overhead.

Each I-O is connected to a respective Pad 120. Typically, each Pad 120 may be formed by metallization (or otherwise) and may connect to an off-die circuit (not shown in FIG. 1) by means of a bond-wire, flip-chip solder bead, or other means as is well-known in the art.

As depicted, each I-O subsystem 110 comprises a corresponding soft wrapper circuit 111, an integrated wrapper for delay digital test (IW-D) circuit 113, an I-O buffer (I-OB) 115, and an integrated wrapper for analog test (IW-A) 117.

The soft wrapper circuit 111 is an I-O wrapper, and may be delivered as soft macro or synthesizable soft core. An I-O wrapper is the circuitry dedicated to each I-O for test and debug operations. The soft wrapper 111 uses a boundary scan mechanism for exchanging test data with their respective I-O using modularity and reduced routing congestion features. In one embodiment, the soft wrapper circuit 111 includes a circuit similar to the digital boundary scan module used in IEEE1149.1 or IEEE1149.4 standards. In an alternate embodiment, the soft wrapper circuit 111 is delivered as hard macros within the I-O frame. A chain of I-O soft wrappers may serve as boundary scan modules for SIS enabled I-O. In one embodiment of the invention, the soft wrapper circuit 111 can support both the IW-A and the IW-D simultaneously. An embodiment of a soft wrapper is discussed in greater detail with reference to FIG. 4A.

The IW-D circuit 113 is the integrated wrapper that is included in each I-O for delay and timing tests. In one embodiment, the IW-D circuit 113 includes launch and capture D-flip flops (211 and 116 respectively) operable to launch and detect transitions for a delay test sequence for each I-O in the I-O segment 100. Accordingly, the action of the IW-Ds 113 may be in support of conducting various types of delay test, including launch and capture response tests. The IW-Ds 113 may act to synchronize and select appropriate timing signals (STB0 and STB1) from strobe conductors. In one embodiment, the IW-D circuit 113 is hardened and included in the I-O frame due to timing critical paths and matching requirements.

The IW-A circuit 117 is included in each I-O for DC and analog test access. In one embodiment, the IW-A circuit 117 is designed as a hard macro and is dependent on the structure and test needs of each I-O. For most bidirectional I-Os, the IW-A circuit 117 includes analog bus (ABUS) routings, which are designed such that they can be connected from one I-O to the next through abutment. These buses form two I-O ring routings. The buses provide electrical access to the I-O Pads 120. For DC parameter test, current and voltage are forced on the Pad 120 using one bus line (e.g., ABUS1a) and Pad voltage measured through the second line (e.g. ABUS1b). In an embodiment, the buses ABUS1a and ABUS1b carry analog signals for one I-O segment. Multiple segment may be used for different I-O voltage domains such as 1.8V, 2.2V 2.5V etc., present in the I-O chain. The two buses carrying analog signals ABUS1a and ABUS1b in the first I-O segment 110a are not connected to the two buses ABUS2a and ABUS2b carrying analog signals in a second I-O segment.

The segmented architecture illustrated in FIG. 1 is supported by analog bus to ground switches 101 in each IW-A. Accordingly, the IW-As 117 may comprise controlled switches 101a, 101b, 101c, 102a, 102b, and 102c, which may each operate under control of an associated soft wrapper 111. Such switches may be embodied as ordinary structures, such as FETs (field-effect transistors). The switches may connect the analog bus ABUS1a, ABUS1b to ground during normal operation that is when placed into application service as contrasted with when undergoing testing. The ground switches 102 are activated when not in analog test mode; accordingly the analog buses are set to ground when not in use, e.g., during a timing test or when in functional mode. This reduces noise associated with floating buses. Grounding an analog bus when unused (such as in normal application operation) may enhance noise immunity. Grounding for this purpose may be for radio frequency signals or more generally for alternating current (AC) signals and need not necessarily involve DC grounding.

Thus, each IW-A 117 has a switch to switch the two analog buses ABUS1a and ABUS1b to ground. Accordingly, IW-A 117a has a first dual pole switch 102a to switch the two analog buses ABUS1a and ABUS1b to PAD in the first I-O 110a, IW-A 117b has a second dual pole switch 102b, which may switch the two analog buses ABUS1a and ABUS1b to the second I-O PAD, and so on.

The IW-A circuit 117 may also include PAD-to-ABUS switches to connect the I-O to the analog buses. These switches may have to be designed to maintain I-O Electrostatic discharge (ESD) protection level. The IW-A circuit 117 may also include ABUS-to-VSS voltage switches to connect the analog buses to the VSS to avoid floating buses when all other PAD-to-ABUS switches are open, e.g., in normal I-O function mode. As indicated by the solid lines in IW-A 117b and 117c, data signals may flow in either direction between Pad 120 and a respective IW-A 117. Analog signals may flow in either direction along the analog bus, which links the IW-As 117 together (e.g., in a "bus" circuit topology).

The IW-As 117 may act to connect the primary data path (and hence the Pad 120) to the analog bus, or to isolate it from that bus responsive to control signals received from the soft wrapper 111.

The analog bus ABUS1a may provide external access for test purposes to the single pad 120a that provides PMU functionality to test the first I-O segment 110a through two or more I-O circuits within the I-O segment 100. Switches 102b and 102c in two of the I-Os in the segment, may each serve to connect one selected conductor of the analog bus ABUS1a, ABUS1b to two Pads 120b and 120c and thence to a corresponding off-die (off-chip) circuit, for example PMU1, PMU2. Circuits PMU1, PMU2 may typically be connected to an external instrument or test gear, for example a PMU. In this way external test circuit access to conductors of the analog bus may be provided, without having dedicated test pins. In this way, two PMUs may connect to each I-O segment that contains large amounts of individual I-Os via two general-purpose I-Os.

Thus, it is possible to use an external PMU to impress signals, via the analog bus, upon an I-O under test and/or to make measurements of test results such as for characterizing I-OBs (and possibly other circuits).

In an embodiment, I-OBs 115 comprise current drivers and receiver circuits. An I-OB 115 may be controlled by a corresponding soft wrapper 111. For example, a soft wrapper 111 may enable either a receiver or a driver at any particular moment.

The segmented analog bus architecture illustrated in FIG. 1 enables I-Os to be tested, even when there may be I-Os on a chip that are not SIS-enabled. This makes it possible to place I-Os with SIS on chips containing non-SIS I-Os. Further, while typically more analog buses would be needed in a single chain architecture to accommodate multiple I-O voltage domains, merely two analog bus lines and four switches in the SIS integrated wrapper are required, regardless of the number of I-O voltage domains. Segmented architecture allows limiting the analog bus length and loading by splitting long chains into smaller chains. This reduces the amount of space required on the chip for the analog buses, and further enables controlled trade-off between the number of tester pin connections and the test time and accuracy. Further, each I-O segment may be tested in parallel, which improves the speed of testing.

The embedded features of SIS may include modification to the I-O soft wrapper subsystems that control test features. Further, special techniques may result in a reduced number of clock cycles being needed to communicate test data with I-Os. This may significantly accelerate tests, sometimes in the range of one or two orders of magnitude relative to using IEEE-1149.1-conforming digital boundary modules. Further, intelligent re-use of soft wrapper registers may reduce the need for on-chip memories such as for saving intermediate test results. Also, the SIS embedded test feature set may be a key enabler in facilitating retained use of low-cost and/or legacy tester(s) thereby reducing test and/or repair costs.

External control of SIS and similar testing features may sometimes require relatively large tester vector memories. Embodiments of the invention may thus provide a series of techniques and methods to resolve or at least mitigate test time and/or tester memory requirements. Several advantages to purchasers and users of devices embodying the invention may be provided. The methods and systems described herein reduce costs associated with testing, enable accurate tests, including timing tests, and provide repair opportunities to improve yields. Accordingly, the methods and circuits described herein may have a superior price and/or performance over previously developed solutions. Moreover, it may be possible to realize devices having superior performance using fewer circuit components and/or less critical component tolerances thus improving reliability, yield and/or providing still further advantages.

Embodiments of the invention enable reduced pin-count testing. Using SIS, a SOC with hundreds or thousands of I-Os may be tested by a tester that supports only a few tens of pins. This allows testing high pin count chips on older testers that support small number of pins. Further, the reduced pin count testing may allow testing more than one chip on a tester simultaneously. This may further reduce the test cost and/or time.

Figure 2:
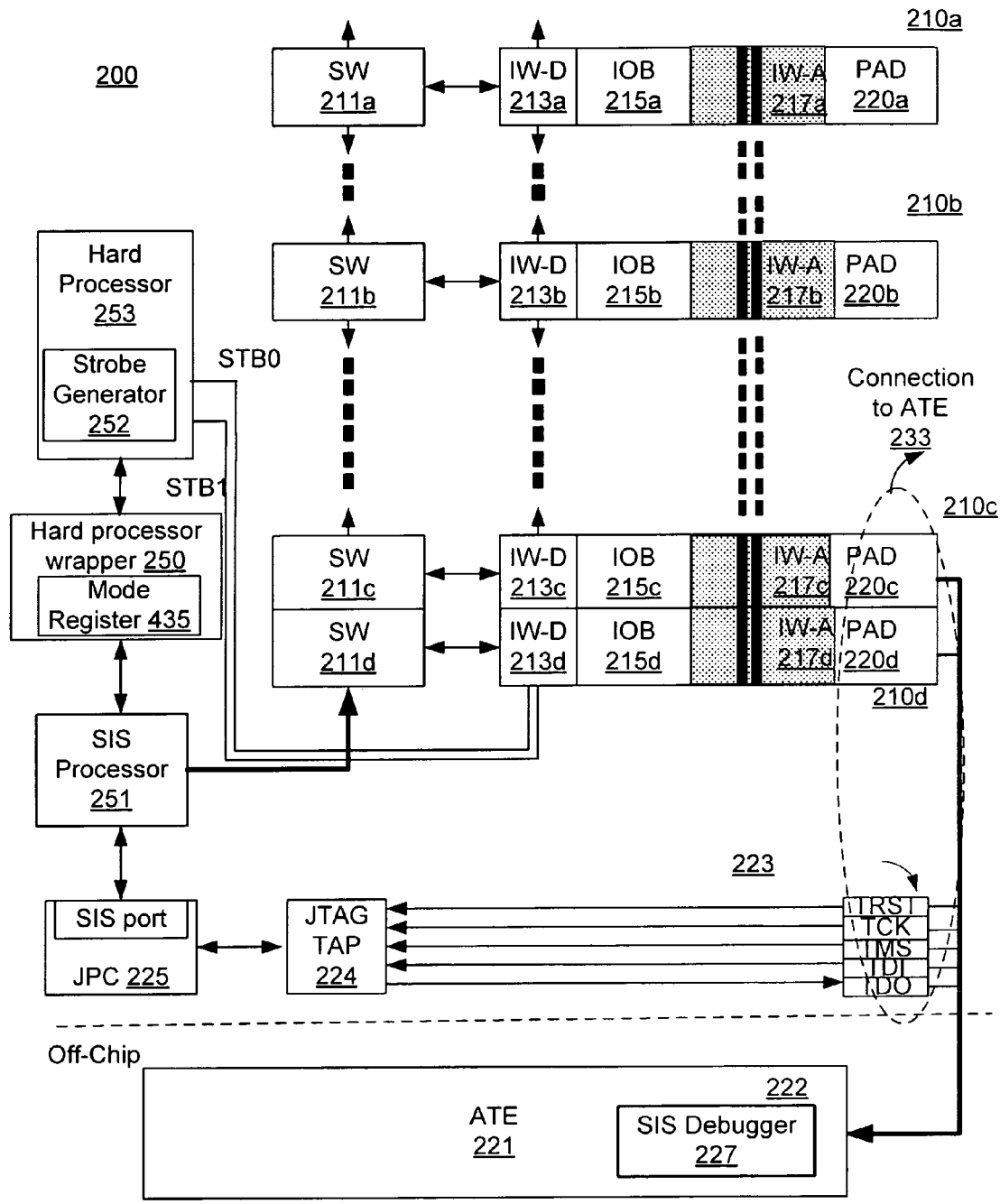
FIG. 2 illustrates a block diagram of an embodiment of a representation of Self-Test and Repair I-O System ("SIS") architecture.

FIG. 2 illustrates a block diagram of an embodiment of a representation of a Self-Test and Repair I-O System ("SIS") architecture that is used to support I-O segments. FIG. 2 illustrates one I-O segment and other on-chip and off-chip components. The SIS 200 includes multiple on-chip and off-chip infrastructure IP components to perform different I-O related test and diagnostic components. The SIS on-chip components include multiple I-O segment (only one shown in FIG. 2), the I-O segment including multiple testable I-Os that are segmented together. For purposes of illustration, four testable I-Os 210a, 210b, 210c, and 210d are shown in FIG. 2. As discussed in reference to FIG. 1, each testable I-O 210 further includes a soft wrapper 211, an integrated wrapper for delay digital test (IW-D) circuit 213, an I-O buffer (I-OB) 215, and an integrated wrapper for analog test (IW-A) 217. The SIS on-chip components also include a hard processor 253, a hard processor wrapper 250, and a soft processor 251.

In the embodiment shown in FIG. 2, the on-chip SIS circuitry is connected to an external automated test instrument 221 via a connection path 222 and connector 233. The connector 233 may provide two analog connections to Bonding Pads 220 and a JTAG (IEEE-1194.1 compatible) block 223 supporting circuits TRST, TCK, TMS, TDI and TDO as defined in IEEE-1194.1 standard. A JTAG Test Access Port (TAP) state machine 224 may also be provided. The JTAG TAP 224 may provide boundary scan capabilities compatible with IEEE 1194.1, as well as other features.

A soft processor 251 is the main instruction processor, and may be delivered as a soft macro. Thus, the ATE 221 has external communication access to the soft processor 251, such as for control, status and data exchange purposes. The soft processor 251 may also generate the control signal(s) for various SIS components, including the hard processor wrapper 250 and I-O chain of soft wrappers (e.g., the chain including soft wrappers 211a, 211b, 211c, and 211d). The SIS processor 251 may control each and any of the soft wrappers 211 by impressing control signals on a boundary-scan control bus. The soft processor 251 may also generate test patterns for BIST operations, and receive and analyze test results for generating on-chip test signatures. The soft processor 251 connects via a JPC (JTAG Protocol Converter) 225 to communicate with the JTAG TAP 224 in order to exchange data with an off-chip tester 221. Thus, the soft processor 251 may direct the soft wrapper circuits 211a-221d as well as be a central instruction processor that controls all operations during testing, generates vector test patterns and analyzes results from the each I-O segment after the testing is applied. In the embodiment depicted, the hard processor 253 resides separately from the I-O subsystems and serves at least to support the control of the strobe generator 252. The hard processor wrapper 253 includes several registers that are addressed by the soft processor 251. These registers receive and/or generate data for the control of the hard processor 253, which is typically used for timing test. The hard processor 253 may be delivered as hard macro.

The chip 200 includes a protocol converter 225, such as a JPC, which acts as a communication bridge between the TAP port 224 and the Test Processor 251.

In one embodiment, the Pads 220 are bonding Pads that are connectable to external test signals PMU1, PMU2 that may be dedicated to testing purposes. In other embodiments, ordinary (i.e. full featured) I-Os may be used to connect to the pads 220 and the external connector 223, as shown in FIG. 2.

The soft wrappers 211 are directed and controlled by the action of the soft processor 251 to impress control signals on the extended boundary scan circuits. In turn, each soft wrapper 211 may control a respective IW-D 213, I-OB 215 and IW-A 217. The soft wrapper chain logic circuit 211 couples to all of the groups of I-O circuits. The soft wrapper circuit 211 has logic configured to send control signals to perform a Direct Current (DC) output voltage parameter tests on the I-Os. The soft wrapper circuit 211 has additional logic configured to send control signals to perform input DC voltage parameter test simultaneously or serially on each I-O circuit in each group of I-O circuits.

The soft wrapper chain 211 exchanges data between each I-O and the test soft processor 251. The soft wrapper chain 211 does both issue commands to the I-Os for testing purposes, and receives the data back from the I-Os for analysis. Thus, in this architecture, each I-O is connected to an associated soft wrapper, such as a first soft wrapper 211 (SW), and may also connect to an associated IWD. In an embodiment, each I-O has an associated soft wrapper. The soft wrappers for the I-Os connect serially to form soft wrapper chain. The IWD uses delay circuits and a launch and capture measurement methodology to perform delay and timing test. The soft wrapper circuit 211 has additional logic configured to send control signals to perform a delay parameter test on each I-O circuit in the group of I-O circuits simultaneously with each other.

The soft wrapper 211 is a digital synthesizable circuit that provides digital stimuli and control signals to each I-O and the IWD. The soft wrapper 211 also captures I-O and IWD signals for later analysis. The soft wrapper chain 211 is connected in a serial architecture similar to the IEEE1149.1 boundary scan modules. The SW 211 exchanges data serially with the I-O test processor 251, which in turn communicates with off-chip equipment through (JPC) JTAG-to-IEEE1500 (JPC) communication converter 225 and the TAP controller 224.

In an embodiment, the soft wrapper circuit 211 is part of an I-O wrapper, and may be delivered as soft macro or synthesizable soft core. An I-O wrapper is the circuitry dedicated to each I-O for test and debug operations. The soft wrapper 211 uses a boundary scan mechanism for exchanging test data with their respective I-O using modularity and reduced routing congestion features. In one embodiment, the soft wrapper circuit 211 includes a circuit similar to the digital boundary scan module used in IEEE 1149.1 or IEEE 1149.4 standards.

In an alternate embodiment, the soft wrapper circuit 211 is delivered as hard macro within the I-O frame. A chain of I-O soft wrapper circuits 211 may serve as boundary scan modules for self test and repair enabled I-Os. The soft wrapper 211a is a digital modified boundary module to optimize test time and area overhead and serial scan of test data to and from the I-Os.

A primary off-chip SIS component is the debugger 227. The debugger 227 is a software module that resides on the ATE 221 and functions to generate/receive the data vectors, and synchronize the PMU with the vectors for exercising different tests through JTAG TAP 224. Another off-chip SIS component is a builder (not shown). The builder is a software component that inserts SIS components on the chip.

Figure 3:
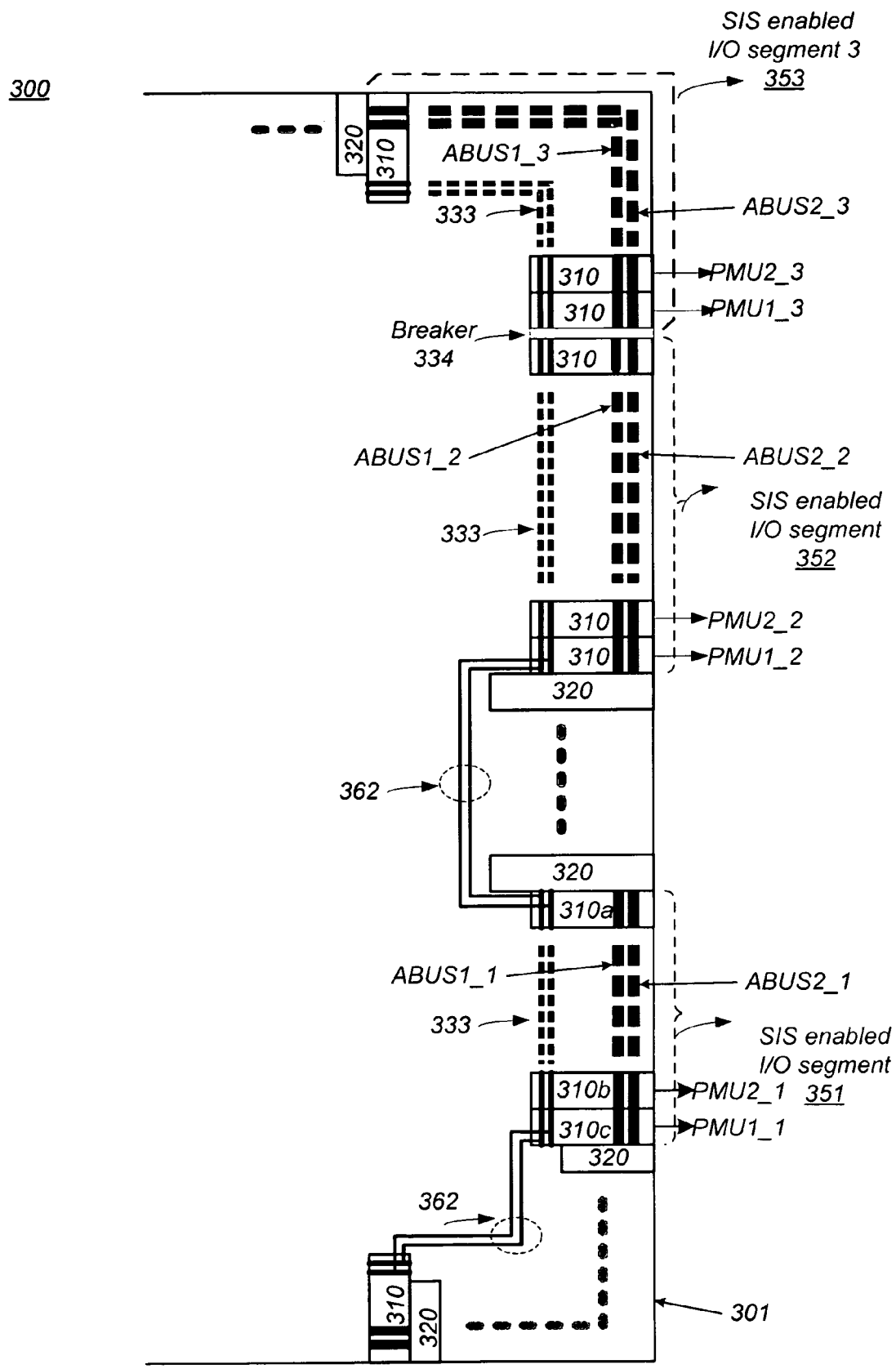
FIG. 3 illustrates a block diagram of an embodiment of a segmented I-O chain.

FIG. 3 illustrates a block diagram of an embodiment of a segmented I-O chain to allow test and repair features for SIS-enabled I-Os even if non SIS-enabled I-Os are present in between them. Accordingly, as shown in FIG. 3, I-Os are divided into segments of SIS-enabled I-Os that form a continuous chain. In each segment, any two I-Os may be connected to two external PMUs to provide analog access to all I-Os in that segment. The two I-Os used for test access are general purpose I-Os and need not be dedicated test pins for test purposes only.

In the embodiment depicted in FIG. 3, for purposes of illustration, three separate chain segments 351, 352, 353 are shown. Thus, the first I-O segment 351 is formed from a first continuous chain of I-Os. The second I-O segment 352 is formed from a second continuous chain of I-Os. The third I-O segment 353 is formed from a third continuous chain of I-Os. The SIS processor contains logic configured that may sequentially access the first I-O segment 351, then the second I-O segment 352, and then the third I-O segment 353 for analog testing, timing test and digital access. The SIS processor may also enable testing some I-O features in different segment in substantially parallel manner.

The I-O segment 351 includes SIS-conforming I-Os 310a, 310b, and 310c. The conforming I-Os 310a, 310b, 310c have digital interconnects and share analog buses ABUS1_1 and ABUS2_1. Multiple on-chip analog buses (ABUS 1, ABUS 2) are used to provide external access to the I-Os through two I-Os (e.g., 310b and 310c within segment 351) within the segment. The pecked lines 333 represent an indeterminate number of other (conforming) I-O subsystems with digital interconnects and analog buses ABUS1, ABUS2. The die 301 also includes non-conforming I-Os 320 that do not share the analog buses ABUS1, ABUS2, and may also not include other features that render them non-conforming. In SIS enabled I-O segment 351, the analog buses are ABUS 1_1 and ABUS 2_1, and the PMUs are PMU1_1 and PMU 2_1. In SIS enabled I-O segment 352, the analog buses are ABUS 1_2 and ABUS 2_2, and the PMUs are PMU1_2 and PMU 2_2. In SIS enabled I-O segment 353, the analog buses are ABUS 1_3 and ABUS 2_3, and the PMUs are PMU1_3 and PMU 2_3.

An analog bus provides electrical access to the I-O Pads. An IC may contain several I-O analog access buses, each corresponding to an I-O segment. As depicted in FIG. 3, for each I-O segment 351, 352, 353, it may be necessary to have a number of off-die connection pairs PMU1, PMU2. For instance, the analog buses ABUS1_1, ABUS2_1 are used to provide external access to the I-Os 310a, 310b, 310c of segment 351 through two I-Os (310b, 310c) within the segment 351. Accordingly, two PMUs (PMU1 and PMU2) access each bus through to selected I-O pins in each segment.

The I-O segments 351, 352, 353 may not be fully connected with one another. Although the analog bus conductors ABUS1_1/ABUS2_1 and ABUS1_2/ABUS2_2, and ABUS1_3/ABUS2_3 may, in some embodiments, usefully be routed to all the segments 351, 352, 353, in general they may be mutually isolated, for many (but not necessarily all) test signals. The ABUS1 and ABUS2 conductors may be connected in the I-O row or column through abutment within a segment. As discussed, between two segments, there is no connection between the ABUS1 and ABUS2 conductors.

Also, although segments may be divided by the placement of non-conforming I-O subsystems or other modules on the die periphery, it may also be desirable in some circumstances to introduce a segment breaker 314 between adjacent I-O subsystems 310 that do implement chaining for test purposes. Accordingly, some segments may be separated with a breaker cell to separate two I-O voltage domains. Other reasons for splitting one I-O segment into two or more segments, e.g., using a breaker, include avoiding long buses, reducing load, increasing test speed, and so on.

The strobe bus conductors 362 conduct strobe signals (e.g., for conducting a delay test) may, in some embodiment, be mutually isolated from one segment to others, in general they are routed to all segments. In one embodiment, the strobe signals are connected by abutment in one segment. Between two segments with a breaker I-O circuit (e.g., segments 352 and 353), the strobe bus conductors 362 may be connected using short routings between the two closets I-Os in the nearest domains. Between two segments with no breaker (e.g., segments 351 and 352), the strobe bus conductors 362 may be connected with abutment to the breaker cell that includes bus routings. The strobe bus conductors typically require less area to implement than clock tree architecture.

Figure 4A:
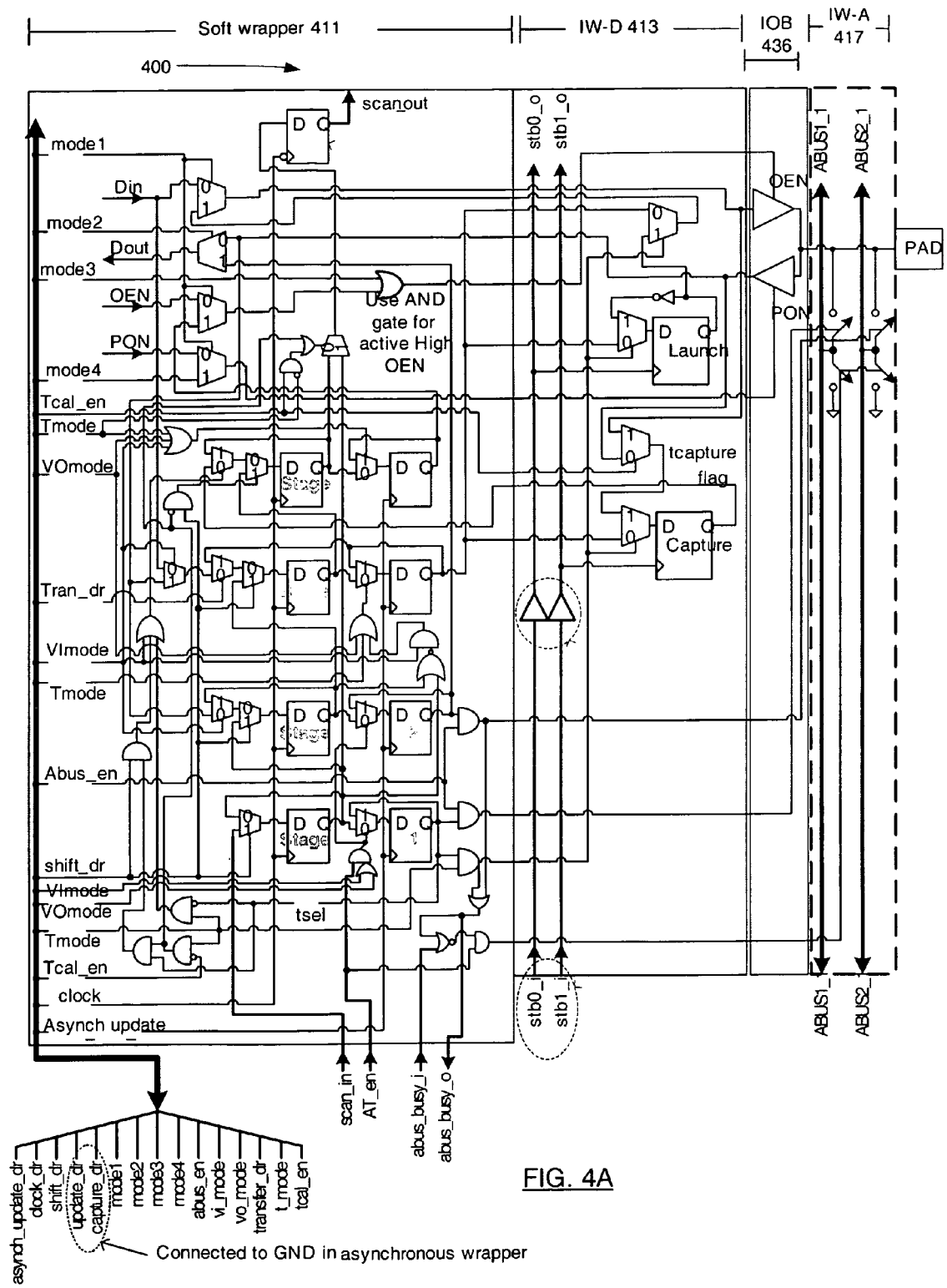
FIG. 4a illustrates a component level schematic diagram of an embodiment of a bidirectional I-O with wrappers for signal control and analog and delay test.

FIG. 4A illustrates a component level schematic diagram of an embodiment of an embedded logic enabled bi-directional I/O with wrappers for signal control and analog and delay test. The bi-directional wrappers in 400 include three major sub-modules: the soft wrapper circuit 411, an IW-D circuit 413, and an IW-A circuit 417. The soft wrapper 411 includes registers and combinational logic. The combinational logic may be made up of Boolean logic gates such as AND gates, OR gates, Inverters, Multiplexers, etc. The integrated wrapper for delay 413 includes buffers, registers, strobe busses, and combinational logic. The IW-A circuit 417 includes analog test busses and switches that receive signals from the combinational logic. The I/O circuit 400 also includes the I/O Buffer module 436 with an output driver amplifier and an input receiver buffer. The I/O output Driver may have a signal applied to its input terminal from three separate sources: the IP core associated with that I/O may send a signal to the I/O driver for that core; the soft wrapper 411 may apply known test vector values to the input of the I/O driver; or strobe signals from the wrapper for delay tests 413 may be applied to the input of the I/O driver. The soft wrapper 411, the integrated wrapper for delay 413, and the analog wrapper 417 are the circuitry dedicated to each I/O circuit 400 for test and debug operations. The wrappers are designed specifically for each I/O type and support different measurements. The IW-D wrapper 413 and IW-A wrapper 417 are separate, but co-exist and may be supported by the soft wrapper 411 simultaneously.

The instruction processor controls the wrapper circuits. The soft wrapper 411 has two or more scan registers, where the data value stored in each scan register can be shifted out for analysis and/or shifted in testing or storage. The soft wrapper 411 has two or more update registers to transfer stored data values between itself and an associated scan register. The soft wrapper 411 has a set of combinatorial logic coupled to the scan registers, the update registers and the instruction test processor. The soft wrapper 411 has these scan and update registers coupled with the combinational logic to enable hold, scan, capture, and transfer states in order to re-use these registers as a temporary memory element when possible.

The set of combinatorial logic further includes logic operable to connect each individual input-output circuit to an analog bus via one or more switches in the IWA 417 in order to perform individual I/O leakage current tests as well as bus leakage current tests, and further operable to isolate each individual input-output port from the analog bus via the one or more switches. The combinational logic may be made up of Boolean logic gates such as AND gates, OR gates, Inverters, Multiplexers, etc.

The soft wrapper logic circuit 411 reduces the test time and on-chip test circuit overhead by locally storing in the soft wrapper logic circuit 411 the results of each individual I-O test if tested sequentially, and shifting in merely enough bits to test the next I-O in line for testing rather than a full shift. For example, one or more of the flip-flops may provide temporary storage for the results of tests run on the I-O corresponding to that portion of the soft wrapper logic circuit 411. When at the final I-O of that group of I-Os completes its testing, then the soft wrapper logic circuit 411 serially shifts out all of the locally stored test results in the flip flops and compares those locally stored test results to expected results.

At the soft wrapper 411, control data comes via a pin and goes through multiple scan stages that capture the control and test signals. The soft wrapper 411 can supply signals to either the IW-A circuit 417, or the IW-D circuit 413, or to both the IW-A circuit 417 and IW-D circuit 413. Accordingly, the IW-A or IW-D may be eliminated in a design that does not need analog or delay test features, respectively. This may reduce area overhead.

The soft wrapper 411 includes MUXes and registers for temporary test data storage. Accordingly, test data at each stage does not need to be shifted out of the soft wrapper immediately. Rather, test data at each stage may be stored in the temporary data storage in the soft wrapper, and be sequentially accessed at a later time. In one embodiment, the soft wrapper 411 supports hold operations on its eight registers. Selective activation of hold state of the registers in different modes of operation provides ability to implement multiple update, capture, and shift operations. These additional operations can be used by different SIS instructions to reduce test time.

At the soft wrapper 411, control data comes via a pin and goes through multiple scan stages that capture the control and test signals. The soft wrapper 411 can supply signals to either the IW-A circuit 417, or the IW-D circuit 413, or to both the IW-A circuit 417 and IW-D circuit 413. Accordingly, the IW-A or IW-D may be eliminated in a design that does not need analog or delay test features, respectively. This may reduce area overhead.

As discussed, the I-O buffer 415 has both the output driver circuit coupled to an input-output port and the input receiver circuit coupled to the input-output port. The soft wrapper 411 has two or more scan registers, where the data value stored in each scan register can be shifted out for analysis. The soft wrapper 411 has two or more update registers to transfer stored data values between itself and an associated scan register. The soft wrapper 414 has a set of combinatorial logic coupled to the scan registers, the update registers and the instruction test processor. The soft wrapper has these registers coupled with the combinational logic to enable hold, scan, capture, and transfer states in order to re-use these registers as a temporary memory element when possible. The combinational logic and registers in the stages in the boundary module in I-O soft wrappers are re-used in the various timing and functional tests to allocate memory in the soft wrappers and the SIS processor for different tasks. This leads to reduced test time and tester vector memory.

Each scan register in each stage may be formed by the flip flops. During shift operations, the content of each scan register can be shifted out to the Test Processor or external tester for analysis, while simultaneously shifting in new content. Each scan register may use its associated combinational logic to have capture capabilities, or hold capabilities, as required by different embedded instructions.

Each update register in each stage may be formed by the flip flops. Each update register may use its associated combinational logic to have update capabilities to transfer stored logic values between itself and an associated scan register in that stage, or hold stored logic values independent of an input applied to the update register.

The soft wrapper 411 includes these flip flop registers and some MUXes for temporary test data storage. Accordingly, test data at each stage does not need to be shifted out of the soft wrapper immediately. Rather, test data at each stage may be stored in the temporary data storage in the soft wrapper itself can be sequentially accessed at a later time. In one embodiment, the soft wrapper 411 supports hold operations on its example number of four scan registers and four update registers.

The soft wrapper 411 includes a digital boundary scan module (DBM), with multiple shift/update stages. The DBM exchanges data with the SIS soft processor (251) for functional tests, delay tests, DC parametric measurements, and IEEE11494.1 standard compliance. The DBM provides boundary scan mechanism for exchanging test data with each I-O because of its modularity and reduced routing congestion features. The soft wrapper 411 is designed to comply with IEEE 1149.1 standard for enabling users to perform board level tests. The soft wrapper 411 supports all mandatory and optional instructions of IEEE1149.1 standard. The soft wrapper also receives a number of global signals from the soft processor to set general modes of operation for all soft wrappers. These global signals are set by a MODE register 430 (see FIG. 4b) in the soft processor. Some of the signals can alternatively be generated in response to specific instructions.

FIG. 4B shows an embodiment of a MODE register 430 in the soft processor. The MODE register 430 sets various modes to control the operation of the scan registers and update registers in the soft wrapper, as well as the operation of the integrated wrapper for delay test and the wrapper for analog tests. In the embodiment shown in FIG. 4B, the MODE register 430 is a 10-bit register.

The mode1_reg bit controls the soft wrapper mode1 signal to the combinational logic coupled to the registers and the I-O driver amplifier during test operations. When active, the value on the I-O driver output PAD is supplied from the soft wrapper or the IW-D rather than the from the associated IP core. When de-asserted, the logic value on the output PAD comes from the associated IP core (Din). The output enable is controlled from the core (if mode1 is 0). When mode1=1 asserted, the value on the output PAD comes supplied from the soft wrapper. This signal controls EXTEST mode in IEEE1149.1 mode of operation.

The mode2_reg bit controls the soft wrapper mode2 signal to the combinational logic coupled to the registers and the I-O receiver amplifier during test operations. When active, the input to the core is supplied by the known test vector value from the soft wrapper in stage3 or IW-D rather than the receiver amplifier of the I-O. When de-asserted, the input to the core Dout comes from the PAD. This signal controls INTEST mode in IEEE1149.1 mode of operation.

The mode3_reg bit controls a global I-O output disable signal to the combinational logic coupled to the registers and the I-O driver amplifier for all of the I-Os in a given segment of I-Os under test. If activated, when mode1=1, the signal disables all I-O output drivers. The global I-O output disable signal when low (mode 3=0) allows each individual I-O's output driver to be enabled or disabled depending on the value of the test vector supplied to stage 4 of the soft wrapper.

The mode4_reg bit controls a global PON signal to the combinational logic coupled to the registers and the I-O receiver amplifier during test operations. When mode1=1, this signal controls the receiver mode. Note: Where applicable in some cell libraries, PON=1 puts any receiver in its default native mode, while PON=0 places them in CMOS or TTL mode. The PON mode control signal when active, puts all I-O input receivers to operate in their native mode. When deactivated, all I-Os will operate in CMOS compatible mode.

The t_mode_reg bit enables the delay test mode to send control signals to the combinational logic coupled to the registers to place various scan registers and update registers in hold mode. This instruction selects the I-O buffers in the timing measurement path for an I-O and compares the I-O path delay against the computed calibrated threshold values for a pass-fail test.

The t_cal_en_reg bit enables the delay test calibration mode to send control signals to the combinational logic coupled to the registers as well as the launch and capture flip flops to establish the delay test path from the launch and capture strobe buses through the launch flip flop to the capture flip flop but exclude the I-O buffers themselves. Thus, bypass the I-O buffers in the timing measurement path for the selected I-Os and measure the delay offset for each selected I-O.

The abus_en_reg bit enables the analog bus global enable mode to send control signals to the combinational logic coupled to the analog bus switches used for at least the DC tests. The analog bus enable signal, when inactive, the analog buses are disconnected from the I-O circuit. The analog bus enable bit, when active, allows each individual I-O's output driver to couple to the analog test bus depending on the value of the test vector supplied to stage 1 or 2 of the soft wrapper.

The vi_mode_reg bit activates the embedded input voltage threshold test (VIL/VIH tests) mode by sending control signals to the combinational logic coupled to the registers. When active, the soft wrapper is configured for embedded input voltage test operation to cause selected update registers to enter into hold mode.

The vo_mode_reg bit activates the embedded output voltage test (VOL/VOH tests) mode by sending control signals to the combinational logic coupled to the registers. When active, the registers and combinational logic in the soft wrapper are configured for embedded output voltage test operation to cause selected update registers to enter into hold mode.

The transfer_dr_reg bit activates the transfer mode by sending control signals to the combinational logic coupled to the registers. When active, this signal enables transfer of some update register data values to the scan registers in the soft wrapper when performing a capture operation.

Figure 5A:
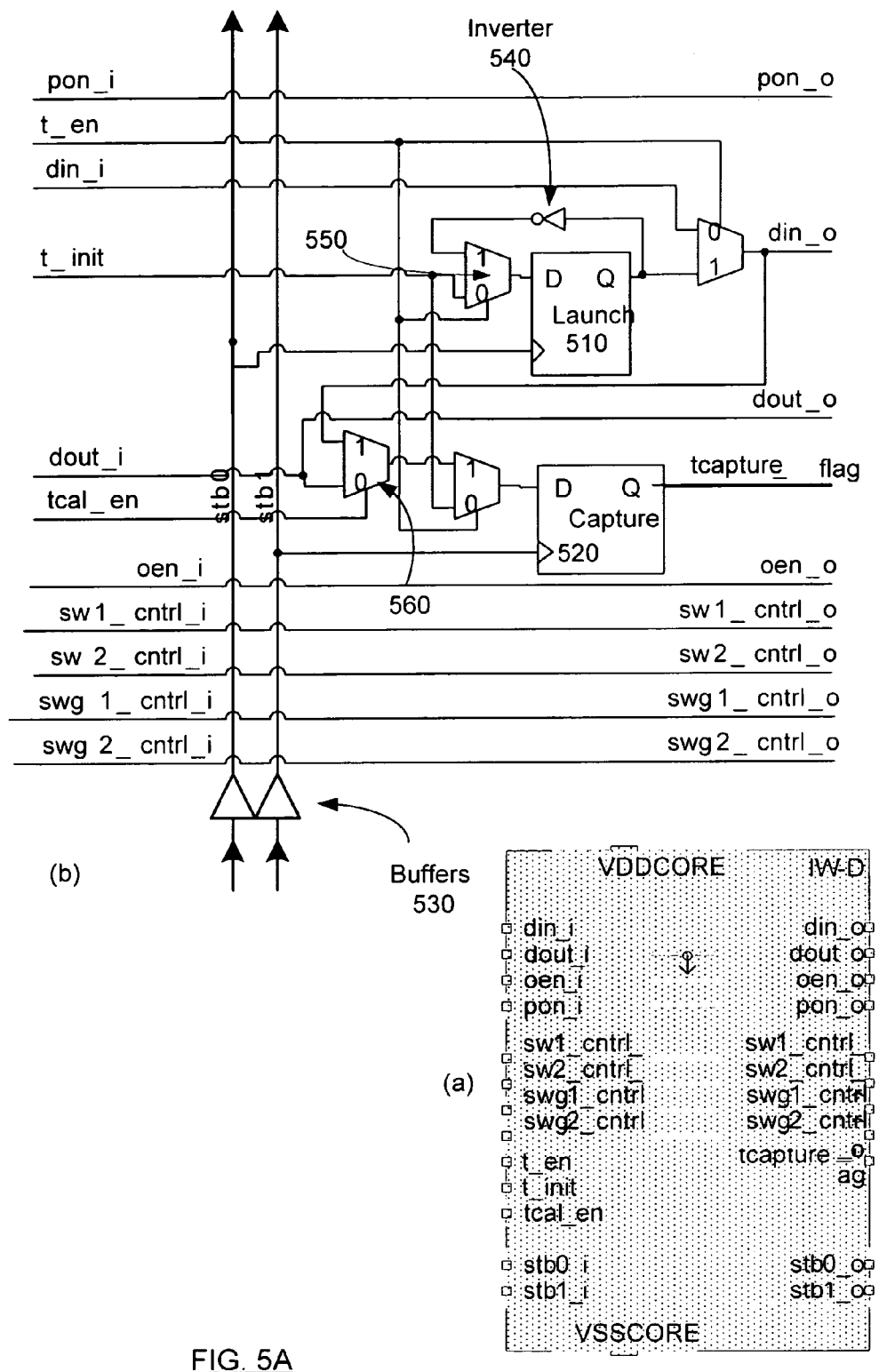
FIG. 5a illustrates a circuit diagram of an embodiment of an IW-D.
Figure 5B:
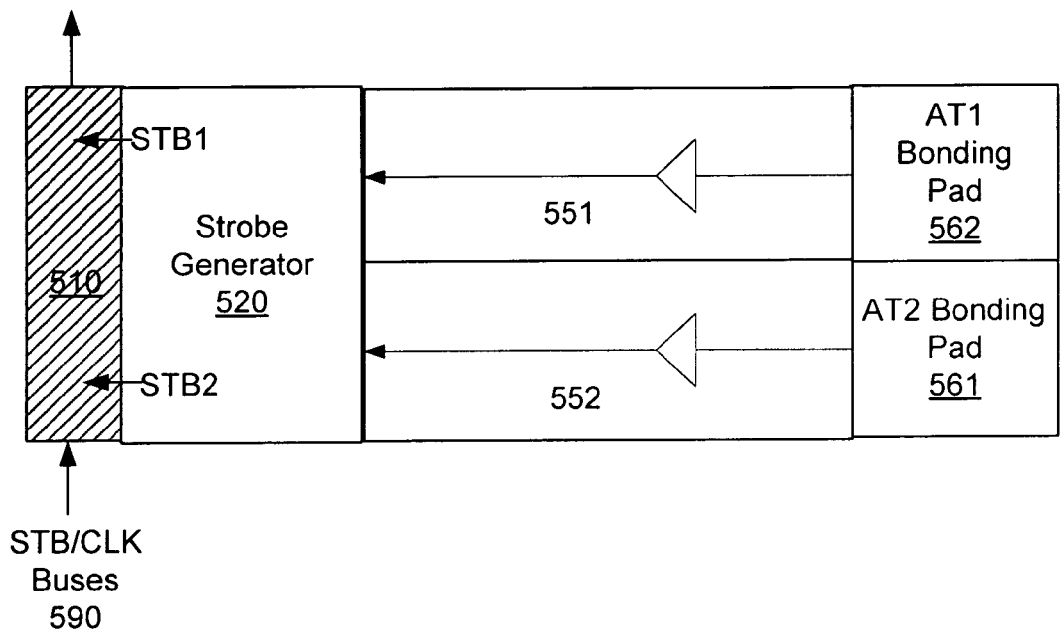
FIG. 5b illustrates a block diagram of an embodiment of a hard processor.

FIG. 5B shows a block diagram of the SIS hard processor 590 according to an embodiment of the invention. The hard processor 500 includes a strobe generation circuit 520. The strobe generation circuit 520 includes circuitry to generate strobe signals with precisely controlled delay between their transitions. In one embodiment, the strobe generation circuit 520 includes two or more delay-locked loops (DLLs) supplied with the same clock, but having the number of taps that are prime relative to each other, e.g., N and (N+1). This circuit 520 can also generate clock with programmable phase delay between them, which may be used for jitter measurement, if needed. The strobe signals are used for I-O buffer delay tests and measurement. The hard processor 590 may further include strobe distribution buses 591. Thus, the strobe generation circuit is operable to provide a set of timing signals to each IW-D of each O-O. The strobe generation circuit is directed by the instruction processor. The timing signals control the delay test sequence.

In one embodiment, the hard processor 590 includes two bonding pads 562 and 561. In the embodiment shown, the hard processor 590 that includes two receiver I-O buffers 551 and 552. The buffers 551 and 552 are used for receiving reference clock, or external strobe/clock signals.

In one embodiment, different tests are performed using external instructions. Accordingly, an external tester provides input data and analyzes the test results. The external tests are more suited to debug, characterization, and repair operations. The external instructions allow full data shift-in and shift-out to all SIS registers, and control of different I-O logical, timing, and DC tests through JTAG TAP. The pattern generation, analysis, and sequence control is provided by the tester through JTAG TAP. The external instructions provide maximal flexibility because of higher degree of freedom in selecting patterns and analyzing them, but require larger tester vector memory and test time. These instructions are generally reserved for characterization and debug application.

In one embodiment, the external instructions support the following I-O tests and measurements: 1) Logic test (using 0101 ... or 1010 ... I-O chain pattern), 2) Timing test: I-O IN and OUT buffer delay (Rising edge delay and Falling edge delay), 3) Output DC voltage test (VOH/VOL), 4) Input DC voltage threshold test (VIH/VIL), and 5) Leakage current test (Positive leakage (11H) and Negative leakage (IIL)).

Logic Test (Functional Test)

In one embodiment, the I-O wrapper is used to perform a logic function test. The logic is applied to the I-O from the core side and is received at the I-O receiver output to the core terminal. The logic transfer to the I-O and capture is done through soft wrapper, which has structure similar to the 1149.1 boundary scan modules.

Figure 6:
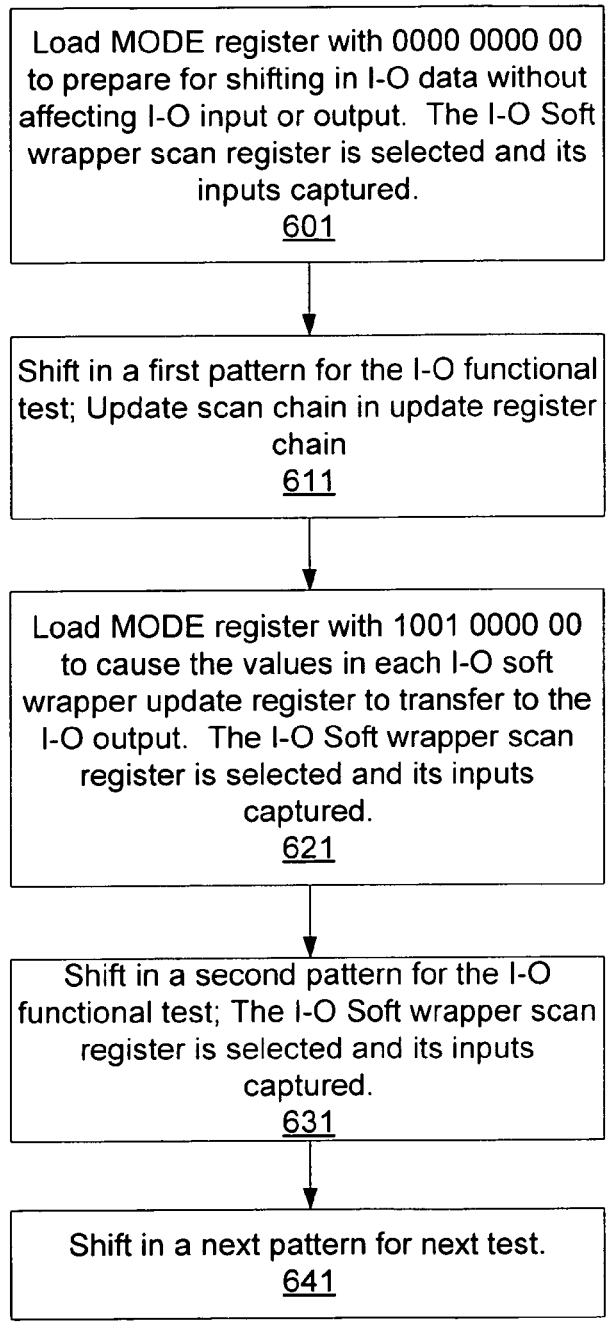
FIG. 6 illustrates a block diagram of an embodiment of a method of performing a logic test.

For functional tests, the soft wrapper 411 applies 0 or 1 to the I-O and captures the I-O input receiver logic to check whether I-O can transfer the logic correctly. The combinational logic enables a full shift scan of the scan registers to read the test results by the tester. FIG. 6 refers to a method 600 of performing a logic test according to one embodiment of the invention.

At block 601, the MODE register 430 value, which sets the soft wrapper global signals, is loaded with the value 0000 0000 00 to prepare for shifting in I-O data without affecting I-O input or output. The I-O Soft wrapper scan register is selected and its inputs captured. This is part of IEEE1149.1 state diagram.

At block 611, a first pattern is shifted in for the I-O functional test. The pattern is generated at and supplied by external tester, which may be on-chip or off-chip. The pattern should set the stage1 and stage2 in each I-O soft wrapper to 0 to disconnect the I-O from the analog buses, and stage4 to 0 to enable the I-O output driver. The stage3 is set alternatively to 0 and 1 for adjacent I-Os. The scan chain in update register chain is updated.

At block 621, the MODE register 430 is next set to 1001 0000 00 to cause the values in each I-O soft wrapper update register to transfer to the I-O output. The I-O soft wrapper scan register is selected and its inputs captured.

At block 631, a second pattern is shifted in for the I-O functional test. The pattern is generated at and supplied by external tester, which may be on-chip or off-chip. The pattern should set the stage1 and stage2 in each I-O soft wrapper to 0, and stage4 to 0. The stage3 is set alternatively to 1 and 0 for adjacent I-Os. Simultaneously, the I-O soft wrapper captured signals are shifted out to off-chip tester for analysis. The scan chain in update register chain is updated.

At block 641, a pattern for a next test is shifted in. The pattern is generated at and supplied by external tester, which may be on-chip or off-chip. If no other test is planned, then an all-0 pattern is shifted in. Simultaneously, the I-O soft wrapper capture signals are shifted out to off-chip tester for analysis. The scan chain in update register chain is updated and the next test performed.

Timing Test Initialization

The major timing parameters of an I-O are buffer in-to-PAD and PAD-to-out delays and output rise and fall time. This test only measures the combination of in-to-PAD and PAD-to-out delays. The delay is tested using sequential delay measurement techniques, which is based on launching a transition at the input of the I-O, passing it through I-O wrap path, and capturing it with a delayed capture clock or strobe. Due to the bus based routing of strobe signals, any mismatches in the paths of STB0 and STB1 can accumulate and result in large errors at I-Os far from the strobe generator. To resolve this issue, this error is first measured and then calibrated.

The IW-D 413 is operable to launch and detect transitions for a delay test sequence for each I-O in an I-O segment. In order to create a transition at the output of the Launch DFF 510, the IW-D 500 shown in FIG. 5A uses an inverter 540 and MUX 550 feeding back the Launch DFF output to its input. The Launch DFF 510 is initialized by transferring a 0 or 1 to its input through the I-O soft wrapper and activating one or more rising edges on the stb0. Subsequently, select the input 1 of a feedback MUX 550 to turn the DFF 610 into a toggle flip-flop. Another rising edge is activated on the stb0 to generate a transition of the DFF 510 output. This method provides the flexibility to launch a programmable transition pattern on the different I-Os, while requiring merely one I-O soft wrapper shift. Further, because the initialization data is written merely once, test time is saved. Also, it is easier and faster to initialize the IW-D registers and perform testing of rising and falling edges.

For calibration, the output of the Launch DFF 510 is sampled by the Capture DFF 520 through three MUXes. This allows estimation of delays through the MUXes and DFFs and also residual delay error between the two strobe signals. This estimate later is used to eliminate these errors and calibrate the measurements. Upon the generation of the launch signal, the IW-D then captures a voltage response after a time interval selected by an instruction processor from a plurality of selectable time intervals.

Figure 7:
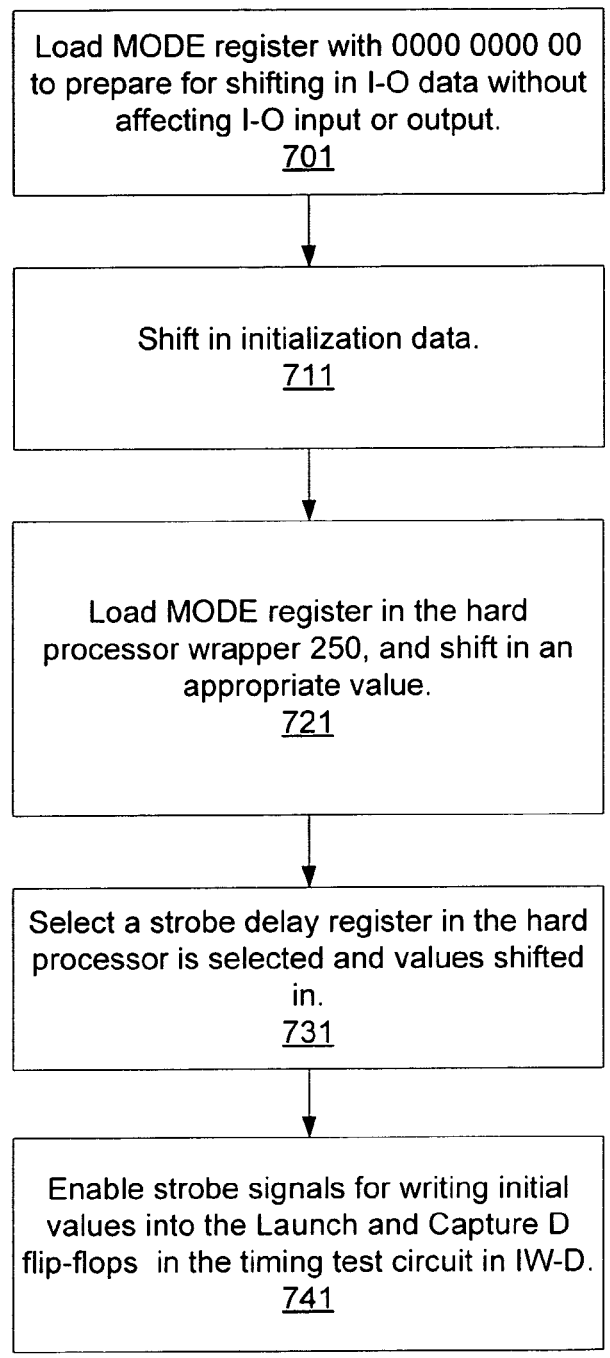
FIG. 7 refers to a method of initializing I-O segments for a delay test of each I-O in a segment according to an embodiment of the invention.

A timing test initialization sequence may be required for I-O delay calibration and test. The following sequence of instructions may be involved for timing test circuit initialization. FIG. 7 refers to a method of initializing an I-O group for a delay test of each I-O in a group according to an embodiment of the invention. A data value stored at an output of a launch register and a capture register of each I-O wrapper in an I-O group is initialized by writing a known data value to a respective input of these launch registers and capture registers. The launch registers and the capture registers are then clocked with one or more strobe signals to write the known data values into the launch register and the capture register of each I-O in the first I-O group. A full shift-in operation is performed with an external tester of an initialization pattern with the known data values into wrapper circuits of one or more I-Os.

Referring to FIG. 7, in step 701, the mode register in the test processor is loaded for the delay test initialization by shifting in the proper initial value. The mode register is set to 0000 0000 00. This is to prepare for shifting in I-O data without affecting I-O input or output.

At block 711, if appropriate initialization data is not shifted in the soft wrapper scan stages (for example in the last stage of functional test), execute the following steps: select the I-O chain soft wrapper register, capture the I-O soft wrapper inputs, shift in the timing test initialization pattern, and update the scan chain in update register chain. The timing test initialization pattern should set the stage2 in each I-O soft wrapper to 1, and stage4 to 1. The stage3 set alternatively to 0 for rising edge delay test and 1 for falling edge delay test. The stage1 is not relevant for initialization, but if set to 1, the I-O will be selected for timing test or calibration in next stage of the test.

At block 721, a MODE register 435 in the hard processor wrapper 250 is loaded, and an appropriate value shifted in. The SIS processor 251 may send an instruction to select the hard processor wrapper mode data register 435 to allow setting the analog switches and strobe generator controls. The scan chain in update register chain is updated. For initialization, an RST pin in the strobe/clock generator 252 is set to 0. If clock is supplied internally, an src_mode signal in the strobe/clock generator 252 is set to 01. If clock is supplied externally, an src_mode pin in the strobe/clock generator 252 is set to 10. If strobes are supplied externally, an src_mode pin in the strobe/clock generator 252 is set to 11. For initialization, an RST pin in the strobe/clock generator 252 is set to 0.

At block 731, a strobe delay register in the hard processor is loaded to generate a small delay between the two strobe signals.

At block 741, the strobe signals are enabled for writing initial values into the Launch and Capture D flip-flops (510 and 520 respectively) in the timing test circuit in IW-D 500. Two nearly simultaneous rising edges are generated on stb0 and stb1 buses that feed Launch and Capture D flip-flops in IW-A block. It may take several reference clock cycles before the IW-A D flip-flops are initialized.

Timing Calibration

Figure 8:
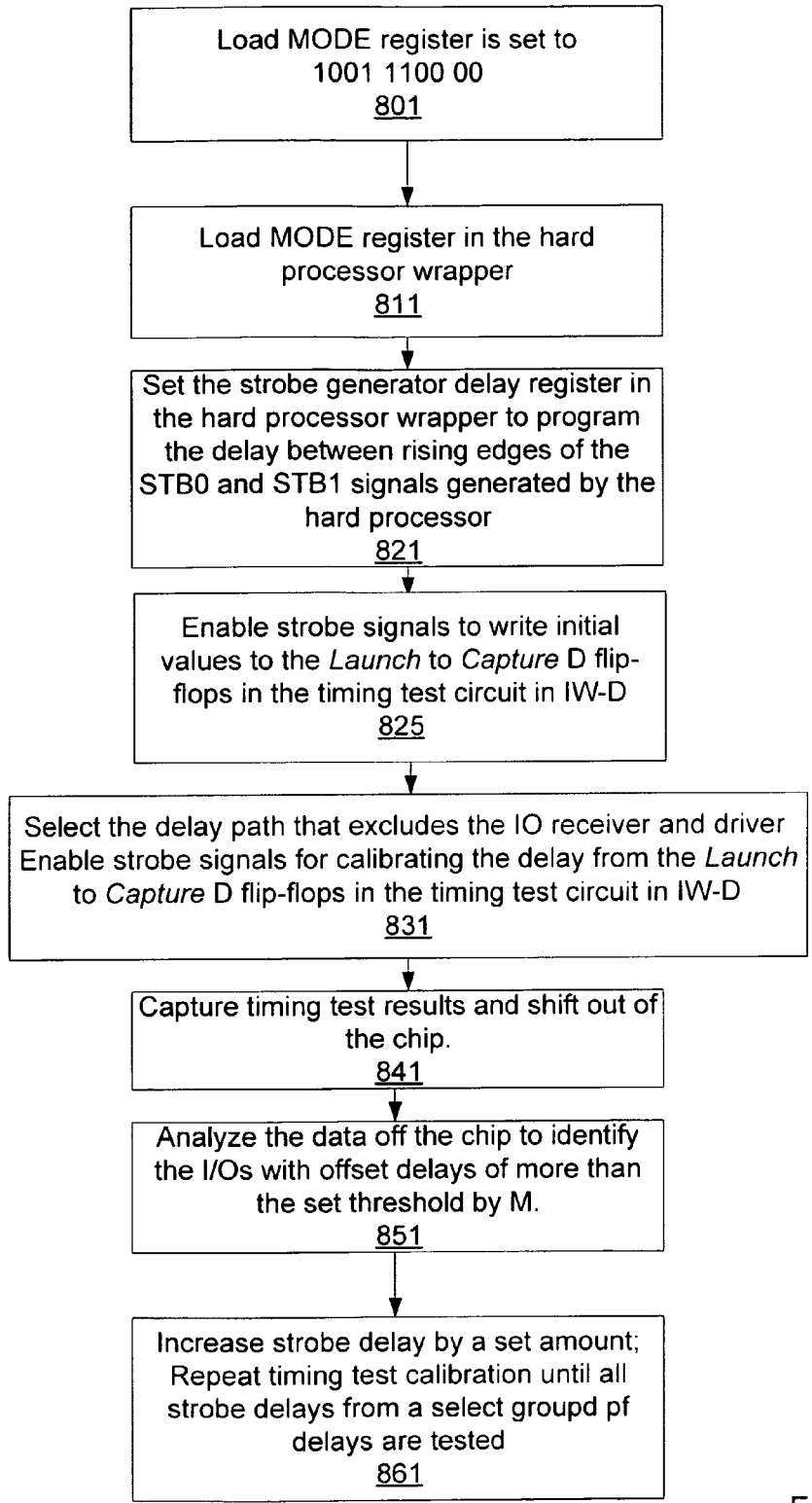
FIG. 8 refers to a method of generating calibration data for a delay test of each input-output circuit on a chip according to an embodiment of the invention.

FIG. 8 refers to a method 800 of generating calibration data for a delay test of each input-output circuit on a chip according to an embodiment of the invention. A full shift of test vectors is used for each increment of delay sweep value tested, as discussed below.

Referring to FIG. 8, overall, a delay calibration instruction determines an amount of delay present in a delay testing path excluding the input-output circuit buffers themselves in each input-output circuit in an I-O segment at the same time. The amount of delay present in each delay testing path may be accounted for when delay testing an input-output circuit associated with particular delay testing path. For timing test calibration, it is assumed that the desired initial values are written to the IW-D D-flip flops of the selected I-Os. The selected I-Os are the ones whose stage1 in the respective I-O soft wrapper is set to 1.

Determining of the amount of delay present in the first delay-testing path excluding the buffers of a first I-O involves measuring a delay period of time from a launch signal to a capture signal through the first I-O including its buffer circuit, measuring the delay period of time from the launch signal to the capture signal by using a sweep pattern of known delay values between the launch and capture signal, and examining a status of a capture flag for the first I-O to the sweep pattern of known delay values to equate the delay value of the first delay testing path in the first I-O exclusive of a delay time through the buffer circuit itself. The soft wrapper is loaded such that a number of I-Os are selected, their flags captured and kept in an external tester; a new pattern shifted in, the I-Os tested for a second strobe delay, their flags captured and kept in the external tester. A capture operation is performed on the scan registers for each increment of strobe delay sweep value. A full shift of test vectors is performed after testing a first increment of strobe delay sweep value in order to test the next increment of strobe delay sweep value.

At block 801, a MODE register 430 is set to 1001 1100 00. This is to prepare the I-O for launching a transition to its Din input and capturing Dout signal. At block 811, MODE register 435 in the hard processor wrapper 250 is loaded, and an appropriate value shifted in. For calibration, an RST pin in the strobe/clock generator 252 is set to 0. A pin src_mode of the strobe and clock generation block 252 in the hard processor 253 is set to 01 if the clock is supplied internally, to 10 if the clock is supplied externally, and 11 if the strobes are supplied externally.

At block 821, the strobe generator delay register in the hard processor wrapper is set to program the delay between rising edges of the STB0 and STB1 signals generated by the hard processor. Accordingly, the strobe generator delay register in the hard processor 253 is set and values shifted in. This step is not performed if strobes are supplied externally. Otherwise, if clock is provided to the strobe generator 250, the strobe delay register of the strobe/clock generator 250 is set to M, which corresponds to a strobe delay that is M times a known delay resolution. Initial value for M=M0, where M0 is a negative integer obtained from the chip I-O chain specifications. The M0 represent the minimum error due to the strobe buses and IW-Ds that need to be measured and later calibrated.

At block 831, strobe signals are enabled for calibrating the delay from the Launch to Capture D flip-flops (510 and 520 respectively) in the timing test circuit in IW-D 500. The strobe signals are enabled to test the IW-D path delay against the strobe delay. This launches two rising edges on stb0 and stb1 buses that feed Launch and Capture D flip-flops in IW-D block. It may take some time before the timing launch and capture is completed.

At block 841, the timing test results are captured and shifted out of the chip. Timing test results are captured and shifted out of the chip by selecting a soft wrapper chain register, capturing soft wrapper inputs, shifting out the soft wrapper content, simultaneously shifting in the timing test initialization pattern for the next timing test, and updating the scan chain in update register chain.

At block 851, the data off the chip is analyzed to identify the I-Os with offset delays of more than the set threshold M. On the tester, each I-O has an associated delay calibration variable. This variable is incremented only while the captured tcapture_flag is the same as the initial value set for the I-O.

Subsequently, at block 861, M is incremented by 1 to increase strobe delay by a set amount and timing test calibration repeated until M equals a maximum value, which corresponding to a worst case IW-D and strobe bus delay. For each value of M, the flags from the capture DFF in IW-D are analyzed. When this flag for an I-O is the opposite logic of the initialization value for a given M value, the total residual delay error due to strobe buses and IW-D for that I-O is M that of the strobe generator resolution. This value is used later in I-O delay test to calibrate the test thresholds. In one embodiment, the calibration procedures improve the accuracy of timing and delay tests and can be implemented on the chip with minimal area overhead for thousands of I-Os. M is incremented by one and control returns to block 821 until $M=M_{max\_cal}$.

I-O Delay Test

Figure 10:
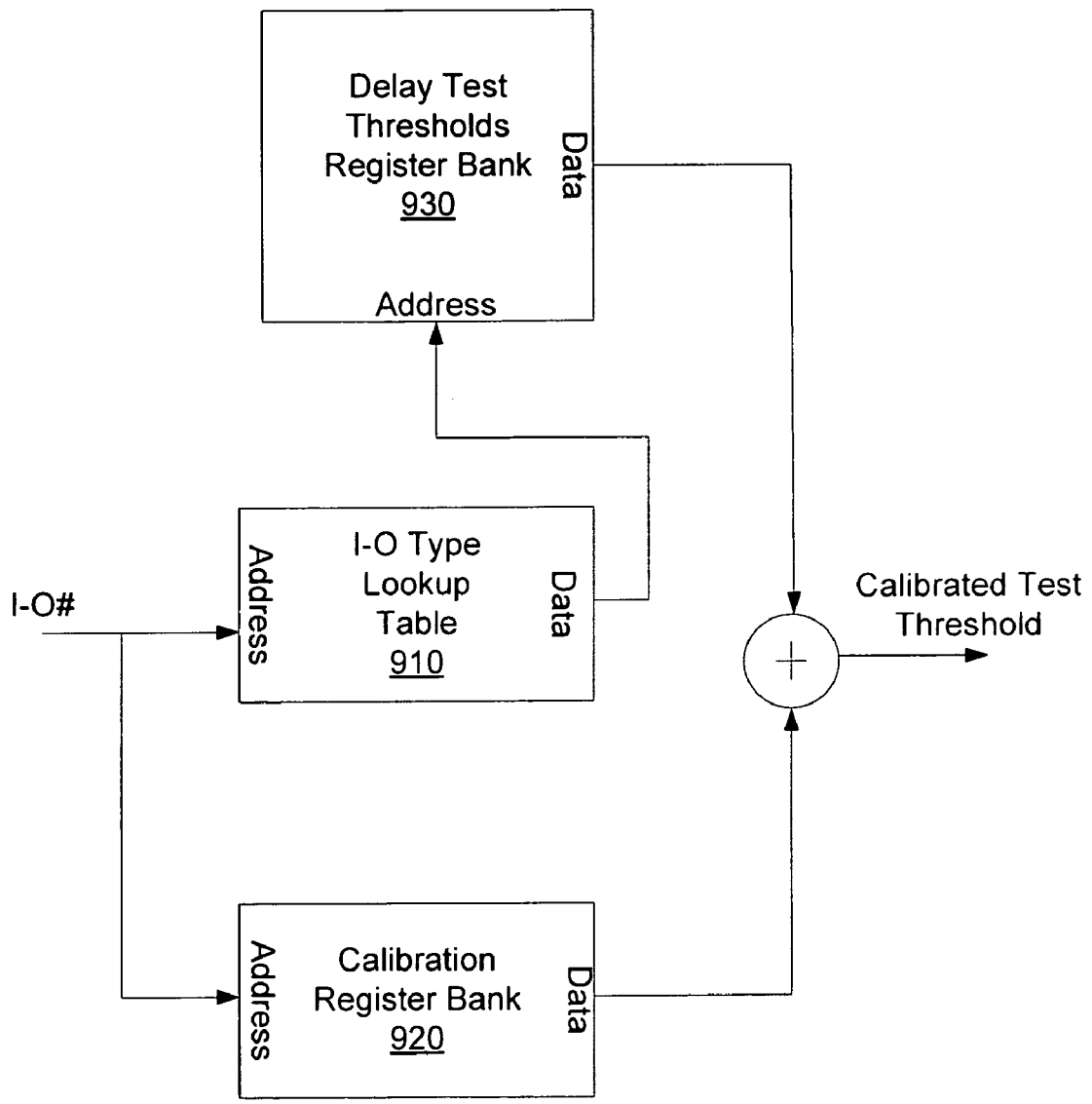
FIG. 10 illustrates a block diagram of a system to generate a calibrated delay test threshold.

In one embodiment, performing a delay test on one or more I-Os involves determining a threshold delay period associated with a category of I-Os associated with that first I-O by matching the I-O under test to a table 910 shown in FIG. 10 that establishes an acceptable delay value for an I-O type that the first I-O under test falls into. The table 910 is stored on the external tester. Circuit 950 is either located on the chip, or off the chip. A calibrated threshold delay period for the I-O under test based upon both a measured accumulated error in a delay path exclusive of the first I-O's buffers and the threshold delay period associated with that category of I-Os. A launch signal and a capture signal spaced by the calibrated threshold delay period through the first I-O of the first I-O group is generated. A captured flag indicative of the delay is shifted to an external tester for analysis. The captured flag corresponding to an amount of delay period of time from the launch signal to the capture signal through the first I-O is compared to the generated threshold delay period to evaluate the timing results for the first I-O in the group of I-Os. A full shift operation is performed to shift the captured flag from every I-O in the group of I-Os to the external tester in a single shift cycle.

Figure 9:
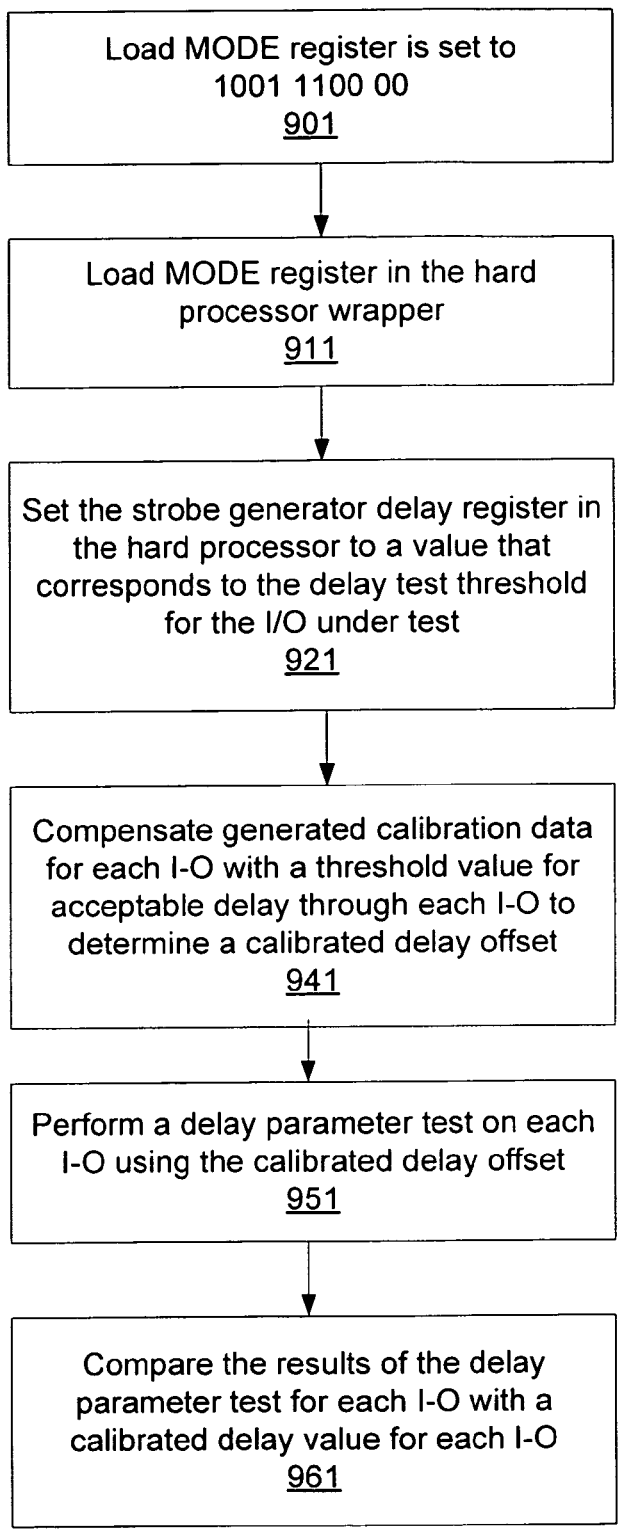
FIG. 9 illustrates an embodiment of a method to perform an I-O delay test.

FIG. 9 illustrates an embodiment of a method 900 to perform an I-O delay test. At block 901, it is assumed that the desired initial values are written in to the IW-D 413 D-flip flops (not shown) of the selected I-Os. The selected one or more I-Os are the ones whose stage1 in corresponding soft wrappers are set to 1. A MODE register 430 in the SIS processor 251 is selected and preloaded with the value 1000 1000 00 to prepare an I-O for launching a transition to a Din input and capturing Dout signal. At block 911, the strobe delay is then set by selecting a strobe generator delay register in the hard processor wrapper.

At block 921, for test applications, strobe generator delay register in the hard processor wrapper is loaded with a value that corresponds to the delay test threshold for the I-O under test. If strobes are supplied externally, this step is skipped. For diagnosis applications, the delay register value is swept in a given range to measure the I-O delay. In an accurate test, the delay register is set to the calibrated threshold, i.e., the delay offset for that I-O IW-D and strobe buses should be subtracted from the desired threshold, as illustrated in FIG. 10.

At block 931, calibration data for a delay test on one or more I-Os is generated by determining an amount of delay present in each delay testing path excluding the I-O buffers themselves. At block 941, the generated calibration data is compensated for each I-O with a threshold value for acceptable delay through each I-O to determine a calibrated delay offset, which is used to perform a delay parameter test on each I-O at block 951. Calibration threshold data for the delay test is generated based upon the I-O type, an identity of the I-O being tested, and the determined amount of delay present in the delay-testing path for that I-O. At block 961, the results of the delay parameter test for each I-O are compared with a calibrated delay value for each I-O. The calibration delay offset and the calibrated delay test threshold is determined in an off-chip or an on-chip external tester.

As illustrated further in FIG. 10, calibration threshold data for the delay test is generated based upon the I-O type, an identity of the I-O being tested, and the determined amount of delay present in the delay-testing path for that I-O and stored in a calibration register bank 920. Calibration threshold value is compensated with an offset value stored in register bank 930 to obtain a calibrated offset. The external tester, or an on-chip processor performs the operation of compensating the delay threshold. Upon testing one I-O, another one may be tested by selecting it and then performing I-O delay test in a similar fashion.

Continuity Test

The purpose of continuity test is to determine whether the I-O pad on the silicon die is connected to the external package pin. Special techniques are required to test the connection due to lack of tester connection to most I-O pins. Thus, perform an external continuity test to determine whether a pad of an Input-Output (I-O) circuit being tested is connected to an external package pin on a chip. One method of testing the connection is using a resistive load, while another is using a capacitive load.

When using the resistive load, all I-Os, except the one connected to tester 221, are connected to resistors on a load board. The resistor value is selected for placing nominal DC load on each pin, e.g., 250 ohm ($\Omega$) for 10 milli-ampere (mA) current load for a 2.5 volt (V) I-O. Detection of significant leakage current at AT1/AT2 pins while the I-O output is disabled indicates the connection of external resistor to the die, hence pad-to-pin connectivity. This method may affect the input voltage low/high (VIL/VIH) and leakage current tests. For instance, the large DC load may make it difficult to apply necessary voltage to the PAD through ABUS1 due to significant voltage drop on the switches connected between ABUS1 and the I-O and also ABUS1 and AT1. The significant load current may also mask any faulty leakage current. Thus, an output driver circuit of the I-O under test may be disabled. The I-O under test may be connected to the on-chip analog test bus. The external tester forces a voltage through a PMU connected to the I-O under test.

Figure 11:
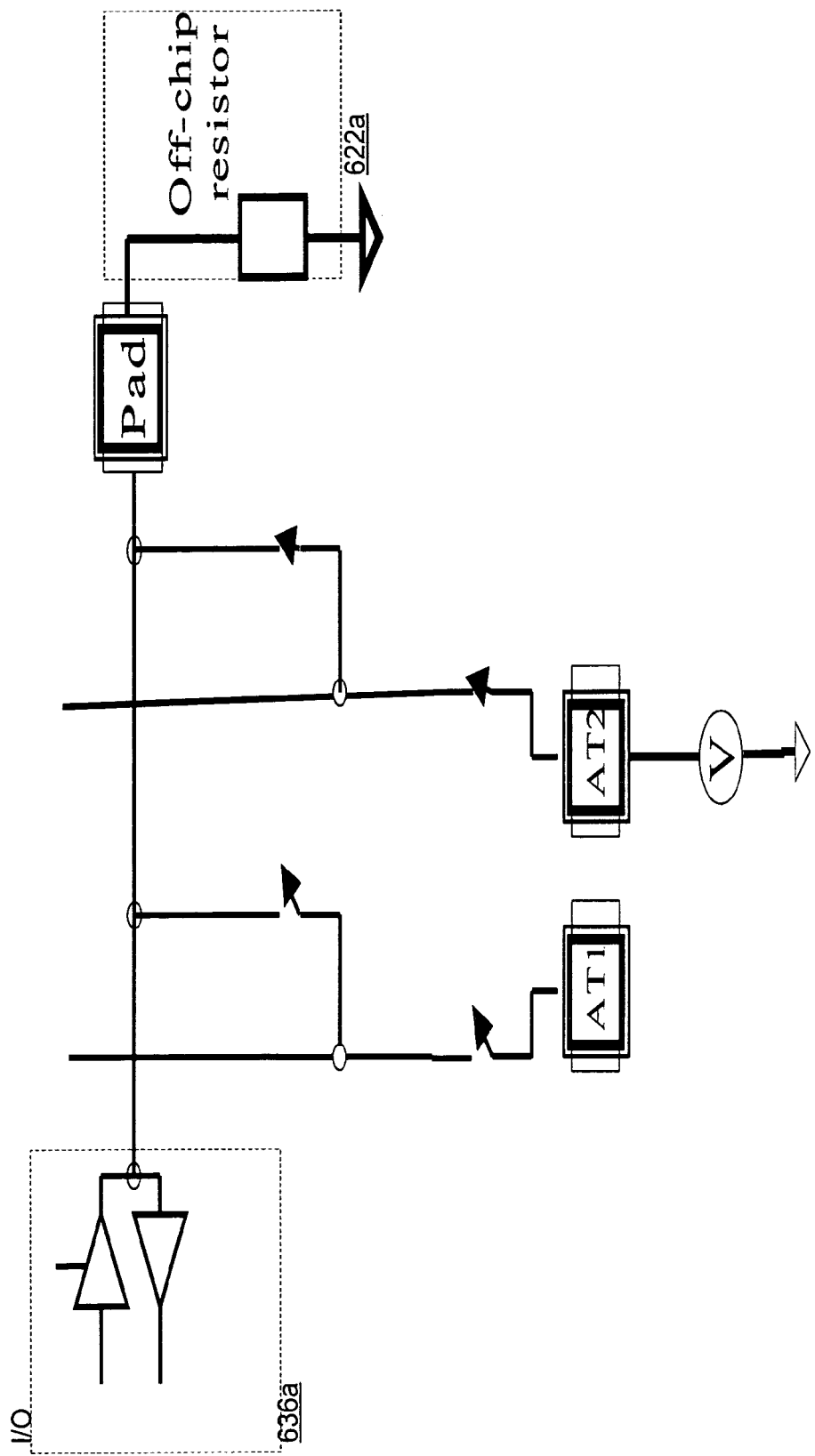
FIG. 11 illustrates a circuit diagram of an embodiment of an Input-Output (I-O) circuit connected to its own resistor to undergo a Direct Current (DC) voltage parameter test and 2) DC current parameter test.

The external tester measures current at the output of the I-O under test. Finally, a determination is made that the pad of the first I-O is connected to the external package pin if a measured current is larger than a leakage current of the first I-O. FIG. 11 illustrates a circuit diagram of an embodiment of an Input-Output (I-O) circuit connected to a resistor to undergo a Direct Current (DC) voltage parameter test and 2) DC current parameter test. The off chip resistor 636a may act as a nominal load or a buffer during the DC voltage parameter tests and) DC current parameter test.

When using the capacitive load, external capacitors are connected to the I-O pins. The capacitor also helps to increase fault detection by activating the AC drive problems at I-O output. Large capacitor values may reduce the test speed for the DC tests. Therefore, capacitor values are optimized. Typically, 5 pf to 10 pf will allow sufficiently accurate measurement within 2 microseconds. In one embodiment, testing continuity using a capacitive load includes enabling the output driver circuit of an I-O to be tested, performing a delay test thru the I-O to detect an amount of delay time through that I-O, and determining that the pad of the first I-O is not connected to the external package pin if detected delay time is smaller than an expected delay, given the off-chip capacitive load.

Another method of performing a continuity test is to perform a loop-back test. In this method, one I-O is connected to another one. Detection of logic written to one of the I-O output can be detected at the other I-O receiver. If correct logic is received, it is assumed that pad-to-pin connection as OK for both I-O in the loop-back path. This method does not isolate which of the I-Os connections is broken if the test fails. Also, a known test pattern may be applied by an external tester to the I-Os being tested to perform the external test. The results of known test patterns are then analyzed to determine if the pad-to-pin connections are satisfactory.

In one embodiment, the capacitive load is used for continuity test because the capacitor is needed to conduct the delay test, and the delay test method described in sections can be used to implement the test. If calibration is performed in a test sequence, the calibration results can be easily analyzed to detect discontinuity by looking for I-Os that are too fast, in other words, too small I-O delay.

DC Parameter Testing

In one embodiment, for DC parameter testing, the analog bus is used, which includes two metal routings. The bus provides electrical access to the I-O pads. Current and voltage are forced on the PAD using one bus and PAD voltage measured through the second bus. A single chip may have multiple segments of I-Os, each segment containing SIS-enabled I-Os that contain the two analog buses. Thus, a chip may contain several I-O analog access buses, each corresponding to an I-O segment. Any two I-Os in each segment may be connected to external PMUs for performing DC tests. Two PMUs access each bus through two selected I-O pins in the segment. Types of DC parameter test include: VOH/VOL test, VIH/VIL Test, Leakage Test.

The soft wrapper logic circuit 411 may cooperate with the external tester to perform a DC output voltage test and debug on each I-O. As discussed previously, the soft wrapper logic circuit 411 performs a Direct Current (DC) voltage parameter test and/or a DC current parameter test on each I-O circuit in a group of I-O circuits connected through its own resistor to a first pin on an external test unit that executes a Parametric Measurement Unit (PMU) function.

Each I-O has its output High and Low voltage (VOH and VOL) measured. Overall, VOH/VOL tests include comparing each I-O's output voltage to a pre-determined value for logic High or Low when a nominal current is supplied or sunk to/from the I-O.

Output Voltage Test

In one embodiment, a DC output level supplied from each I-O circuit in an I-O segment is determined by enabling an output driver, and current flowing to the PMU from an individual I-O circuit under test is measured. An output driver is enabled, and a first amount of current forced to the first PMU from an individual I-O circuit under test. An output voltage is measured with a second PMU from that I-O.

Figure 12:
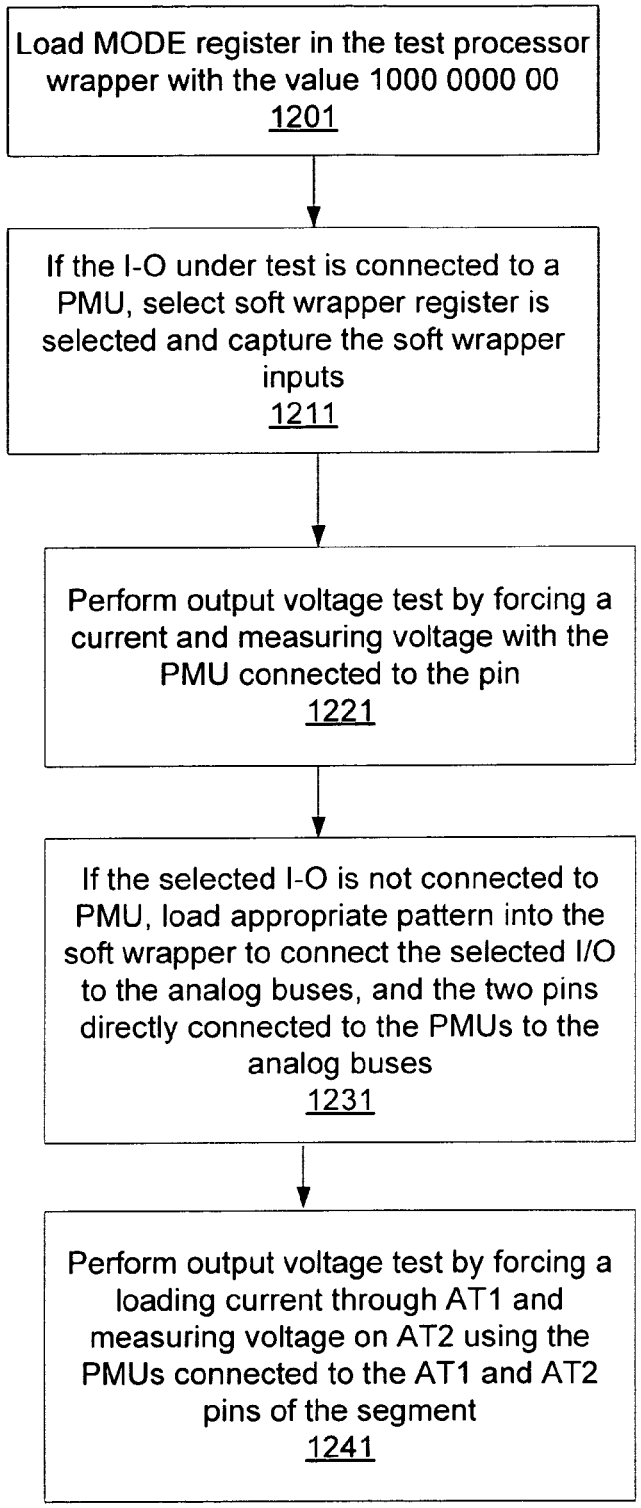
FIG. 12 illustrates an embodiment of a method to perform a DC output voltage level test.

An example, sequence of steps to perform a DC output voltage level test is shown in FIG. 12. Output voltage is measured using the on-chip analog buses. The I-O load current may be supplied through the bus or externally.

At block 1201, the MODE register 430 value in the hard processor is preloaded with the value 1000 0000 00 to prepare the I-O for output DC voltage tests. Control registers in the hard processor are loaded to disable the input to the strobe generator, which effectively reduces noise within the hard processor. A DC output voltage level, corresponding to a logic high or logic low, supplied from each I-O circuit in the group of I-O circuits, is determined by one I-O circuit at a time doing the following operations.

At block 1211, if the I-O under test is connected to a PMU, soft wrapper register is selected and the soft wrapper 411 inputs (Part of IEEE1149.1 state machine) are captured. At block 1221, an output test pattern is shifted in such that stage1 and stage2 switches are open (stage1=0, stage2=0). The OEN for all I-Os is set to 1 (stage4=1), except for the I-O under test. The output logic (stage3) for the selected I-O is set to 0 or 1 for testing VOL or VOH, respectively. The scan chain in update register chain is updated. At block 1221, output voltage test is performed by forcing a current and measuring voltage with the PMU connected to the pin. At block 1231, if the selected I-O is not connected to PMU, the following pattern is loaded into the soft wrapper:

a. For AT1 and AT2 in the segment that the selected I-O belongs to:
   AT1: (stage4, stage3, stage2, stage1)=1X01
   AT2: (stage4, stage3, stage2, stage1)=1X10
 b. Selected I-O:
   (stage4, stage3, stage2, stage1)=0011 (for VOL) or 0111 (for VOH)
 c. For other I-Os:
   (stage4, stage3, stage2, stage1)=1000

The soft wrapper chain in the update register chain is updated. At block 1241, current is loaded through AT1 and voltage measured on AT2 using the PMUs connected to the AT1 and AT2 pins of the segment to which the I-O belongs.

Input Voltage Threshold Test

In one embodiment, the input voltage thresholds are measured using the on-chip analog buses. The outputs of I-Os are disabled to place them in the input mode. A proper voltage corresponding to the VIL or VIH is forced to the I-O input through the PMU1/AT1/ABUS1. The I-O voltage is measured using the ABUS2/AT2/PMU2 to ensure that the correct voltage appears on the I-O input. The next step is to detect the logic at the output of the I-O receiver with the relevant soft wrapper. The captured logic is later transferred to the tester for analysis.

Figure 13:
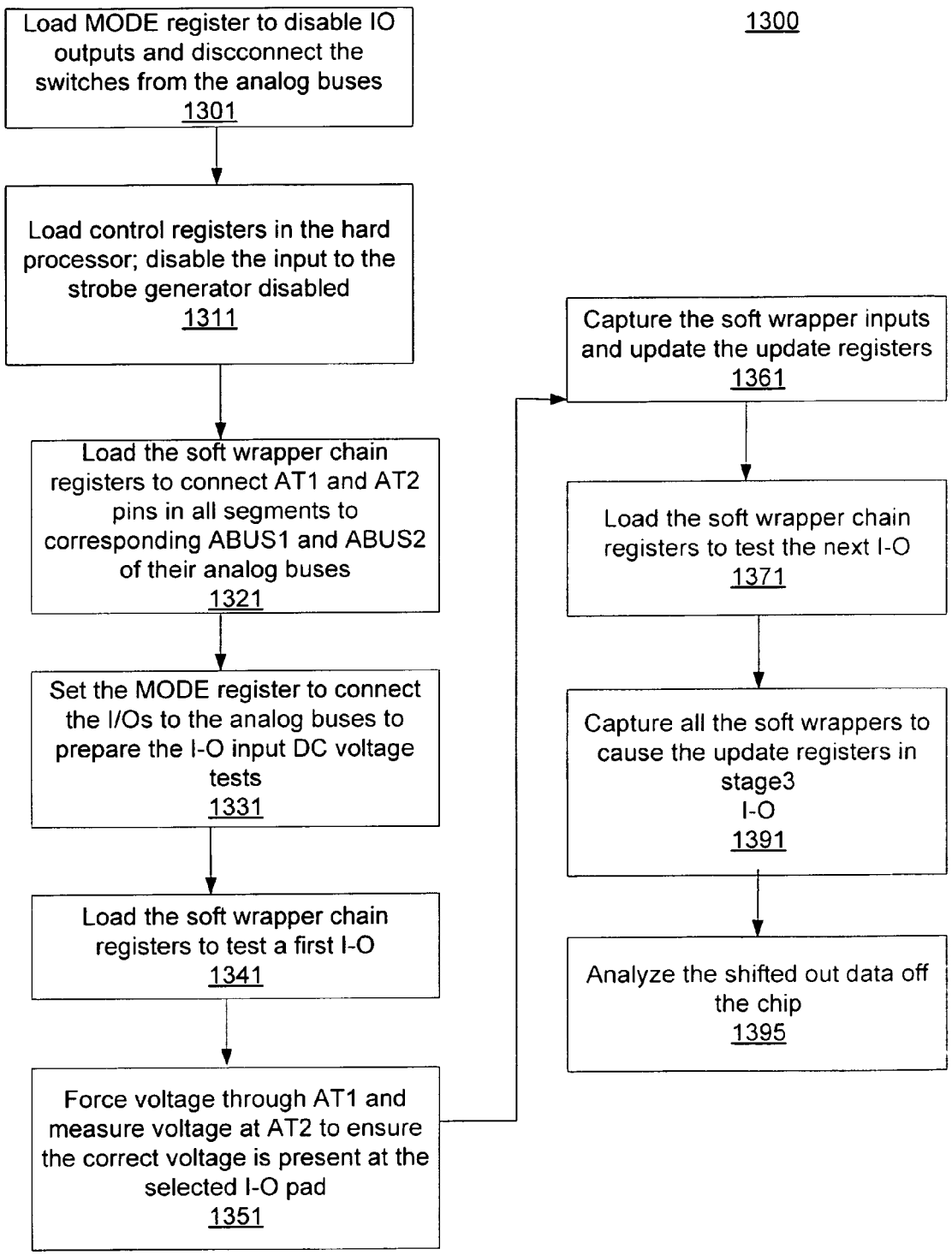
FIG. 13 illustrates an embodiment of a method to perform a DC voltage input test.

FIG. 13 illustrates an example of a method 1300 to perform a voltage input test. At block 1301, the MODE register 430 value is preloaded with the value 1011 0000 00 to prepare for the I-O input DC voltage tests. At block 1311, the control registers in the hard processor are loaded and the input to the strobe generator disabled to reduce noise within the hard processor. At block 1321, the soft wrapper chain registers are loaded to connect AT1 and AT2 pins in all segments to corresponding ABUS1 and ABUS2 of their analog buses, by capturing the soft wrapper inputs (part of IEEE1149.1 state machine), shifting in a voltage setup value into a soft wrapper chain scan register, and updating the soft wrapper chain. The setup values may be:
 (i) AT1: (stage4, stage3, stage2, stage1)=1X01
   AT2: (stage4, stage3, stage2, stage1)=1X10
 (ii) All other I-Os:
   (stage4, stage3, stage2, stage1)=0000

At block 1331, the MODE register 430 is set to 1001 0001 00 to prepare the I-O input DC voltage tests. At block 1341, the soft wrapper chain registers are loaded to test a first I-O by capturing soft wrapper inputs (part of IEEE1149.1 state machine), shifting in the voltage setup value into the soft wrapper chain scan register, and updating the soft wrapper chain. The setup values may be:
 (i) AT1: (stage4, stage3, stage2, stage1)=1X01
 (ii) AT2: (stage4, stage3, stage2, stage1)=1X10
 (iii) Selected I-O (first I-O): (stage4, stage3, stage2, stage1)=001
 (iv) All other I-Os:
   (stage4, stage3, stage2, stage1)=0000

At block 1351, a voltage is forced through AT1 and measured at AT2 to ensure the correct voltage is present at the selected I-O pad. At block 1361, the soft wrapper inputs are captured, a shift skipped, and the soft wrapper updated. Update register in the stage3 only updates if the stage1 and stage2 in that soft wrapper are set to '1'; in other words, the I-O that is under test. The I-Os for which stage1 and stage2 stages are '0', the update register in stage3 maintains its value. The update register in stage3 stage is used as a storage element for saving the capture results while testing VIL or VIH for other I-Os. At block 1371, the soft wrapper chain registers are loaded to test the next I-O by capturing soft wrapper inputs (part of IEEE1149.1 state machine), shifting the soft wrapper scan chain 4 bits, shifting in 0000 into the first soft wrapper in the chain, and updating the soft wrapper scan chain. All the I-Os are tested in this manner. At block 1381, the MODE register 430 is set to 1011 0000 01 to prepare the I-O input DC voltage tests. At block 1391, all the soft wrappers are captured to cause the update registers in stage3, which are holding the received logics, to be captured in shift register of the stage1. All the bits in the soft wrapper chain register are shifted out and 0000 shifted in simultaneously into all soft wrappers. An update is performed. At block 1395, the shifted out data is analyzed off the chip. The bits in the stage3 correspond to the logical inputs received by the I-O for the VIL or VIH voltages applied to those I-Os.

I-O Leakage Current Test

The leakage current is measured by connecting the I-O under test to the ABUS1 and then to PMU1 through AT1. PMU1 then can measure the current. The actual I-O leakage may be in a few tens of nA, which make it very time consuming to measure. However, the leakage current can quickly be compared against the threshold of 1 µA to 10 µA fairly quickly (in 2 µs or so). Another issue with this method is the additional leakage added by all the switches connected to the ABUS1. These leakages can be first measured by measuring the leakage on AT1 and also AT2 when these pads are connected to the ABUS1 and ABUS2, respectively, while no other I-O is connected to the buses. This leakage is compensated for later.

In one embodiment, multiple measurements are made to detect the leakage current. A first leakage two I-Os directly connected to the PMUs in that segment of I/Os is measured by disconnecting all I-Os in the segment from the analog bus. A second leakage of the two I-Os connected to the PMUs in the segment and the bus is measured by connecting only the two I-Os connected to the PMUs to the bus. The second leakage current is used as calibration. A total leakage current from the first I-O segment is measured by forcing the first pin that connects the PMU to ground DC voltage potential and measuring a second amount of current flowing from the group of disabled I-O circuits to the PMU. Next, each I-O not directly connected to the external tester may have its leakage current determined. Leakage test uses only one of the PMUs. Accordingly, two I-Os may be tested in parallel, one with each PMU.

Figure 14:
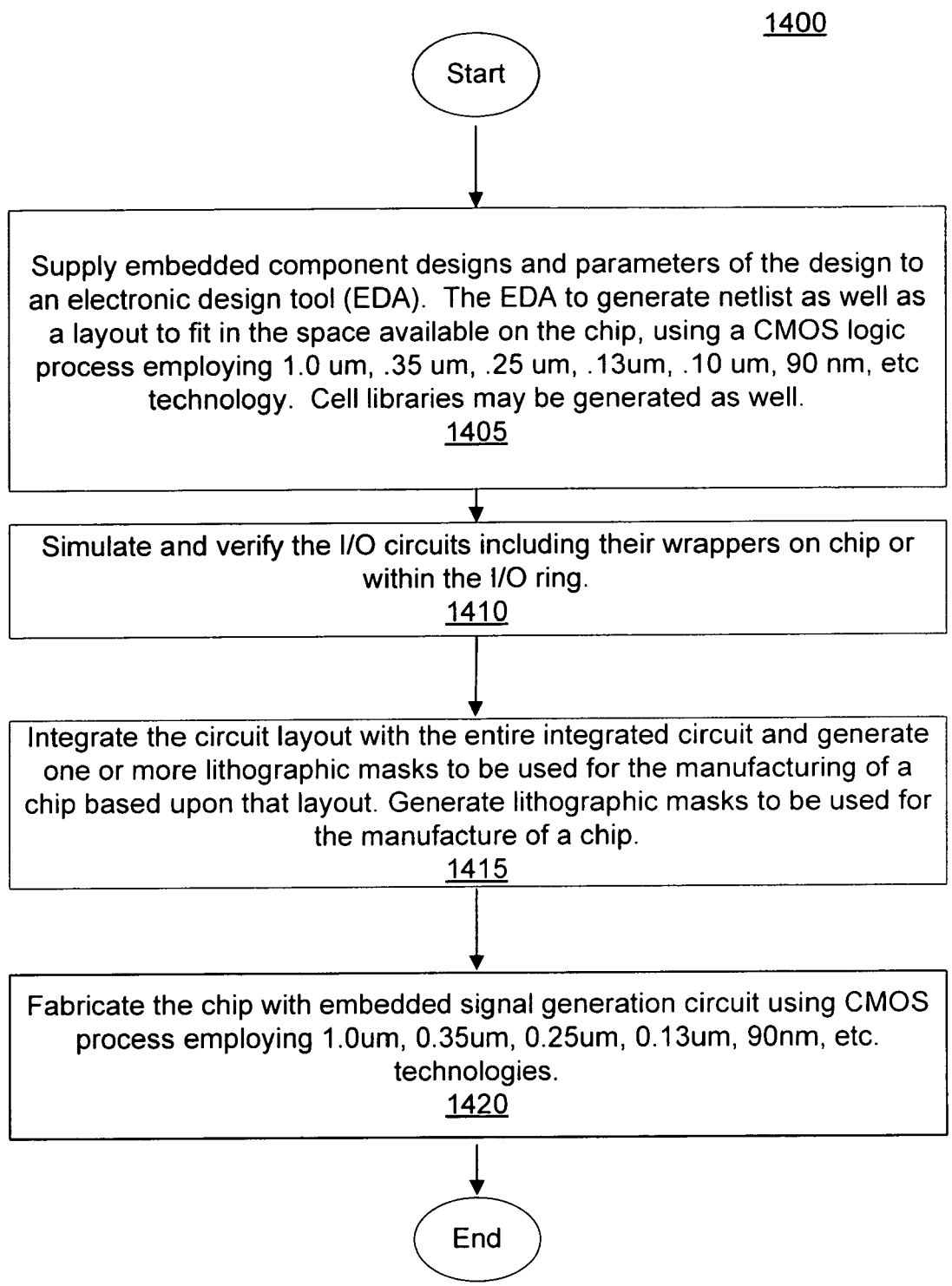
FIG. 14 illustrates an example of a process for generating a device with a test circuit from designs of timing components utilizing an electronic circuit design generator such as may form part of an Electronic Design Automation (EDA) toolset.

FIG. 14 illustrates an embodiment of a method 1400 to test leakage current. At block 1401, the MODE register 430 is preloaded with the value 1000 0000 00. At block 1411, the control registers in the hard processor are loaded to disable the input to the strobe generator, which effectively reduces noise within the hard processor. At block 1421, the AT1 and AT2 leakage currents are tested. For AT1 soft wrapper in all segments, stage1 is set to 1 and stage2 as 0 to connect the analog bus line1 to AT1 and provide external access to the bus line1, stage3 is set 0 or 1 (High/Low leakage), stage4 is set to 0 to enable the output of AT1. For AT2 soft wrapper in all segments, stage1 is set as 0 and stage2 as 1 to connect the analog bus line2 to AT2 and provide external access to the bus line 2, stage3 is set to 0 or 1 (High/Low leakage), and stage4 is set to 0 to enable the output of AT2. For all other I-Os, stage1 is set to 0, stage2 is set to 0 to disconnect the analog buses from all I-Os, and stage4 is set to 1 to disable all outputs. After an update, the MODE register 430 is set to 1010 0000 00 to disable all outputs. AT1 and AT2 leakages are measured directly with the PMUs. These measurements can be used to detect leakage faults for AT1 and AT2 because the ABUS1 and ABUS2 leakage are typically small. These measurements also could be used later as offset value for any subsequent measurement because the leakage of other I-Os add to this offset. At block 1421, the MODE register 430 is set to 1001 0000 00 to prepare the I-O leakage test. At block 1421, the soft wrapper chain is loaded by selecting the soft wrapper chain registers, capturing the soft wrapper chain inputs (part of IEEE1149.1 state machine), loading the soft wrapper chain registers:
  i. AT1: (stage4, stage3, stage2, stage1)=1001
     AT2: (stage4, stage3, stage2, stage1)=1010
  ii. All other I-Os: stage4, stage3, stage2, stage1)=0000 (for positive leakage), 0100 (for negative leakage).
  iii. Update the update register.

At block 1431, the soft wrapper chain is loaded to disable the outputs for the selected I-Os (I-O to be tested) by capturing the soft wrapper inputs, shifting in the single or multiple output disable pattern. The stage4 is set to 1 and the stage3 set to the previous value. The stage1 or stage2 that control the analog switches in IW-A are set 1 (but not both) for the selected I-O. AT1 and AT2 soft wrappers are loaded as before and the scan chain in update register chain updated. The leakage current is measured with the PMU connected to AT1 or AT2, whichever applicable. At block 1441, the measurement for the ABUS1 and ABUS2 impact is corrected by canceling the offset value measured before for AT1 and AT2 leakages.

Thus, an external leakage current test on Input-Output (I-O) circuits in a group of two or more I-O circuits is performed. The on-chip analog bus provides external access for the external test to the input-output pins not directly connected to the Parametric Test Unit (PMU). An output driver is disabled for every I-O circuit in the first I-O segment connected to a first pin. The first pin connects the PMU to ground or power supply DC voltage potential. The total leakage current from the first I-O segment under test is measured by forcing the first pin that connects to the PMU and measuring current flowing from the disabled I-O circuits to the PMU. Next, I-O leakage current from each I-O directly connected to an external tester in the group of two or more I-Os but less than all of a plurality of I-Os on the chip is measured by forcing a voltage and disabling an output driver of each I-O directly connected to an external tester. Next, connect one or more I-Os directly connected to the external tester to the on-chip analog test bus. Next, measure a second I-O leakage current from the one or more I-Os directly connected to the external tester in the group. The measured second I-O leakage current includes the leakage current from the on-chip analog test bus. The on-chip analog bus leakage current may be determined by subtracting the first measured leakage current for the I-O by themselves from the measured second I-O leakage current of the I-Os plus the analog bus. Next, connect an initial I-O that does not directly connect to the external tester to the on-chip analog bus and then to an I-O that does directly connect to the external tester. Next, measure a third I-O leakage current from the I-O under test. The I-O leakage current for the I-O under test that does not directly connect to the external tester is determined by subtracting out the measured second I-O leakage current for the I-O directly connected to the external tester in the group plus the bus current from the measured third I-O leakage current. The external tester provides the test patterns applied to the I-Os being tested to perform the external test note.

Overall, the DC parametric test methodology and delay tests described above allow testing a large number of I-Os with only a small number of PMUs and hence small number of tester channel contacts. This method decreases the test cost by enabling testing multiple devices on the same tester simultaneously and/or using a cheaper tester with less number of pins. The mere additional requirement is that the I-Os undergoing the above tests should support an enable/disable feature for pull-up and pull-down transistors, when applicable.

FIG. 14 illustrates a flow diagram of an embodiment of an example of a process for generating a device with a test circuit from designs of the wrapper components. The example process for generating a device with a test circuit from designs of the wrapper components may utilize an electronic circuit design generator, such as a memory compiler, to form part of an Electronic Design Automation (EDA) toolset. The information representing the apparatuses and/or methods for the test circuitry, I-Os etc may be contained in an Instance such as a cell library, soft instructions in an electronic circuit design generator such as a complier, or similar machine-readable storage medium storing this information. The information representing the apparatuses and/or methods stored on the machine-readable storage medium may be used in the process of creating the apparatuses and/or methods described herein.

Aspects of the above design may be part of a software library containing a set of I-O cells. The I-O Libraries provide a very broad set of basic I-O functions and are designed to accommodate more advanced I-O capabilities. The library cells are developed in accordance with industry standards and support a wide range of I-O frequencies. I-O Library is the basis for interfacing to memory, networking, storage, graphics and mixed signal applications. The I-O cells can be designed for either wire or flip-chip I-O bonding strategies, and the libraries contain all of the cells necessary to create a complete pad ring with a strong power rail structure, robust ESD, and latch-up resistance. The I-O Libraries may be ideally suited for 0.13 µm, 90 nm, and even smaller designs where ESD is an increasingly difficult problem. I-O Library cells are well-suited to many different IC designs because they: can be adapted to accommodate multi-gigabit frequencies; generate more robust and reliable I-O rings; support both bond wire and flip-chip implementations (Flip-chip assembly allows more connections to be present on a smaller die); are capable of supplying high current due to power and ground cell design attributes; support different voltage thresholds; and support different current drive strengths thresholds.

The electronic circuit design generator may be used for making a highly configurable, scalable System On a Chip (SOC) input output system that integrally manages input and output data, control, debug and test flows, as well as other applications. In an embodiment, an example electronic circuit design generator may comprise the following: a graphic user interface; a common set of processing elements; and a library of files containing design elements such as circuits, control logic, and cell arrays that define the electronic circuit design generator. The electronic circuit design generator may be used in designing a System on a Chip (SOC). Traditionally, there exist two major stages of SOC design: front-end processing and back-end programming. Front-end processing comprises the design and architecture stages, which includes design of the SOC schematic. The front-end processing may include connecting models, configuration of the design, simulating and tuning during the architectural exploration. The design is typically simulated and tested. Front-end processing traditionally includes simulation of the circuits within the SOC and verification that they should work correctly. The integration of the electronic circuit design may include packing the cores, verifying the cores, simulation and debugging. The tested and verified components then may be stored as part of a library.

Back-end programming traditionally includes programming of the physical layout of the SOC such as placing and routing, or floor planning, of the circuit elements on the chip layout, as well as the routing of all interconnects between components. Thus, the floor plan may be generated imported and edited. After this, the design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist describes the connectivity of an electronic design such as the components included in the design, the attributes of each component and the interconnectivity amongst the components. After the Netlist is generated, synthesizing of the design with Register Transfer Level (RTL) may occur. Accordingly, back-end programming further includes the physical verification of the layout to verify that it is physically manufacturable and the resulting SOC will not have any function-preventing physical defects. The front-end views support documentation, simulation, debugging, and testing. The back-end files, such as a layout, physical Library Exchange Format (LEF), etc are for layout and fabrication.

In block 1405, the designs for the soft wrapper and other circuits to test the I-Os are supplied to the electronic circuit design generator, as well as other device design parameters such as number of delay elements and MUX sizes. Thus, the designs for cell representations making up the I-O circuits and soft wrappers, etc. stored in a cell library may be supplied to the electronic circuit design generator. As discussed, the electronic circuit design generator may be a software program comprised of multiple algorithms and designs for the purpose of generating a circuit design and a layout in a space available on a target chip. The set of application-specific algorithms and interfaces of the electronic circuit design generator may be used by system integrated circuit (IC) integrators to rapidly create a signal generation circuit suitable for the specific application. In an embodiment, this may involve supplying the circuit netlist and layout fitting in a space on the chip, for example in the space equivalent to two I-Os.

An example electronic circuit design generator may comprise the following: a graphic user interface, a common set of processing elements, and a library of files containing design elements such as circuits, and control logic. The library of files containing design elements may be a stand alone program by itself as well. In addition, the electronic circuit design generator may include object code in a set of executable software programs. The electronic circuit generator provides timing diagrams, power and area aspects of each component, models coded to represent the components in order to run actual operation and configuration simulations. The electronic circuit design generator may generate a netlist and a layout targeted to fit in the space available on a target chip. Typically, the electronic circuit design generator will store the data representing the I-Os and test logic circuitry on a machine-readable storage medium. The electronic circuit design generator then may provide the device layout (including the test circuit) to be used to generate one or more lithographic masks utilized in the fabrication of the device including the test circuit. The electronic circuit design generator may also provide a netlist for verification of the device and test circuit.

In block 1410, the electronic circuit design generator may provide designs to simulate and verify the operation of the I-O circuits including their wrappers on chip or within the I-O ring. The machine may also generate simulations of representations of the circuits described above that can be functionally tested, timing tested, debugged and validated.

In block 1415, the generated device layout may be integrated with the rest of the layout for the chip. Also, the machine may generate representations of the circuits described above for simulations, one or more lithographic masks for transferring the circuit design onto the chip during manufacture, or other similar useful derivations of the circuits described above. The machine-readable storage medium may also store instructions for a test generation program to generate instructions for the external tester, the I-O circuits, and the soft wrapper, to run the test sequences for the DC parameter tests, AC tests, and delay tests.

In block 1420, a fabrication facility may fabricate one or more chips with the signal generation circuit utilizing the lithographic masks generated from the electronic circuit design generator's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the test circuit onto the chip itself. In one embodiment, the electronic circuit design generator is designed for embedded applications in a standard CMOS logic process.

Although a method embodiment has been described in reference to I-O tests, it could be applied to other types of applications.

In one embodiment, an electronic circuit design generator may be implemented in software as a set of data and instructions, such as a software cell library callable to other programs or an electronic circuit design generator consisting of an executable program with the software cell library in one program, stored on a machine-readable medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims.

What is claimed is:

1. A method, comprising:
  generating calibration data for an external delay test of Input-Output (I-O) circuits in a plurality of I-O circuits, wherein the plurality of I-Os is segmented together into at least a first I-O segment of two or more I-Os; and
  generating calibration data for the external delay test of each I-O on a chip by determining an amount of delay present in each delay testing path excluding I-O buffers themselves in each I-O; and
  determining if a defect exists in one or more of the I-Os in the first I-O segment of two or more I-Os based on the generated calibration data for the external delay test, where all of the I/Os in the first segment are tested at substantially the same time.

2. The method of claim 1, wherein generating calibration data for the external delay test further comprises:
  performing a full shift-in of test vectors after testing a first increment of strobe delay sweep value in order to test the next increment of strobe delay sweep value, wherein the test vectors are supplied by an external tester.

3. The method of claim 1, wherein generating calibration data for the external delay test further comprises:
  using the generated calibration data for each I-O to compensate a threshold value for acceptable delay through each I-O to determine a calibrated delay offset;
  using the calibrated delay offset to perform the external delay test on each I-O; and
  comparing results of the external delay test for each I-O that used the calibrated delay offset.

4. The method of claim 3, wherein the calibration delay offset is determined in an off-chip external tester.

5. The method of claim 3, wherein the calibrated delay offset is determined in an on-chip test processor.

6. The method of claim 3, wherein the threshold value for acceptable delay is determined in an off-chip external tester.

7. The method of claim 3, wherein the threshold value for acceptable delay is determined in an on-chip test processor.

8. The method of claim 3, further comprising:
  performing a capture operation on scan registers in the I-Os; and
  performing the capture operation on the scan registers for each increment of strobe delay sweep value.

9. The method of claim 3, further comprising:
  generating the threshold value for the external delay test based upon an I-O type, an identity of the I-O being tested, and the generated calibration data for the amount of delay present in the delay-testing path for that I-O.

10. The method of claim 1, wherein the determining of the amount of delay present in the first delay-testing path excluding the buffers of a first I-O further comprises:
  measuring a delay period of time from a launch signal to a capture signal through the first I-O including its buffer circuit;

measuring the delay period of time from the launch signal to the capture signal by using a sweep pattern of known delay values between the launch and capture signal; and examining a status of a capture flag for the first I-O to the sweep pattern of known delay values to equate the delay value of the first delay testing path in the first I-O exclusive of a delay time through the buffer circuit itself.

11. The method of claim 1, wherein generating calibration data for the external delay test further comprises:

applying test patterns to the I-Os being tested to perform the external delay test, wherein the test patterns are provided by an external tester.

12. A machine-readable medium that stores instructions, which when executed by the machine, to generate instructions for the I-O circuits and a soft wrapper, to run test sequences recited in the method of claim 1.

13. A machine-readable medium that stores instructions, which when executed by the machine, to generate an instance to perform the method of claim 1.

14. A method, comprising:

performing an external delay test on one or more Input-Output (I-O) circuits in a group of two or more I-O circuits, wherein the group of I-Os is segmented together into at least a first I-O segment of two or more I-Os;

determining a threshold delay period associated with a category of I-Os associated with an I-O under test by matching a first I-O under test to a table establishing an acceptable delay value for an I-O type that the first I-O under test falls into;

generating a calibrated threshold delay period for the first I-O under test based upon both a measured accumulated error in a delay path exclusive of the first I-O's buffers and the threshold delay period associated with that category of I-Os; and generating a launch signal and a capture signal spaced by the calibrated threshold delay period through the first I-O of the first I-O segment and shifting a captured flag indicative of the delay to an external tester for analysis; and determining if a defect exists in the first I-O in the first I-O segment of two or more I-Os based on the calibrated threshold delay period for the external delay test, where all of the I/Os in the first segment are tested at substantially the same time.

15. The method of claim 14, further comprising:

comparing the captured flag corresponding to an amount of delay period of time from the launch signal to the capture signal through the first I-O to the generated threshold delay period to evaluate the timing results for the first I-O in the group of I-Os.

16. The method of claim 15, further comprising:

generating the launch signal and the capture signal spaced by a calibrated threshold delay period through all I-Os in the first I-O segment.

17. The method of claim 14, further comprising:

performing a full shift operation with the external tester to shift the captured flag from every I-O in the group of I-Os to the external tester in a single shift cycle.

18. The method of claim 14, wherein the table is stored on the external tester.

19. The method of claim 14, wherein performing the external delay test further comprises:

applying test patterns to the I-Os being tested to perform the external test, wherein the test patterns are provided by an external tester.

20. A machine-readable medium that stores instructions, which when executed by the machine, to generate instructions for the I-O circuits, and a soft wrapper, to run test sequences recited in the method of claim 14.

21. A machine-readable medium that stores instructions, which when executed by the machine, to generate an instance to perform the method of claim 14.

* * * * *